(12) United States Patent
Elers et al.

(10) Patent No.: US 7,749,871 B2
(45) Date of Patent: Jul. 6, 2010

(54) METHOD FOR DEPOSITING NANOLAMINATE THIN FILMS ON SENSITIVE SURFACES

(75) Inventors: Kai-Erik Elers, Helsinki (FI); Suvi P. Haukka, Helsinki (FI); Ville Antero Saanila, Helsinki (FI); Sari Johanna Kaipio, Järvenpää (FI); Pekka Juha Soininen, Espoo (FI)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 11/288,872

(22) Filed: Nov. 28, 2005

(65) Prior Publication Data

US 2006/0079090 A1    Apr. 13, 2006

Related U.S. Application Data

(60) Continuation of application No. 10/969,297, filed on Oct. 19, 2004, now Pat. No. 7,329,590, which is a division of application No. 10/049,125, filed as application No. PCT/US00/28654 on Oct. 16, 2000, now Pat. No. 6,902,763.

(60) Provisional application No. 60/159,799, filed on Oct. 15, 1999, provisional application No. 60/176,948, filed on Jan. 18, 2000.

(30) Foreign Application Priority Data

| Oct. 15, 1999 | (FI) | .................................. 19992233 |
| Oct. 15, 1999 | (FI) | .................................. 19992234 |
| Oct. 15, 1999 | (FI) | .................................. 19992235 |
| Mar. 10, 2000 | (FI) | .................................. 20000564 |

(51) Int. Cl.
  *H01L 21/322*    (2006.01)
(52) U.S. Cl. ..................... 438/473; 438/471

(58) Field of Classification Search ................ 438/471, 438/473
See application file for complete search history.

(56) References Cited

U.S. PATENT DOCUMENTS 4,058,430 A    11/1977    Suntola et al.

(Continued)

FOREIGN PATENT DOCUMENTS

EP    0 899 779 A2    3/1999

(Continued)

OTHER PUBLICATIONS

Elers et al., "NbC15 as a precursor in atomic layer epitaxy," *Applied Surface Science*, 82/83:468-474 (1994).

(Continued)

*Primary Examiner*—Zandra Smith
*Assistant Examiner*—Pamela E Perkins
(74) *Attorney, Agent, or Firm*—Knobbe Martens Olson & Bear LLP

(57) ABSTRACT

The present method provides tools for growing conformal metal nitride, metal carbide and metal thin films, and nanolaminate structures incorporating these films, from aggressive chemicals. The amount of corrosive chemical compounds, such as hydrogen halides, is reduced during the deposition of transition metal, transition metal carbide and transition metal nitride thin films on various surfaces, such as metals and oxides. Getter compounds protect surfaces sensitive to hydrogen halides and ammonium halides, such as aluminum, copper, silicon oxide and the layers being deposited, against corrosion. Nanolaminate structures (20) incorporating metal nitrides, such as titanium nitride (30) and tungsten nitride (40), and metal carbides, and methods for forming the same, are also disclosed.

4 Claims, 8 Drawing Sheets

U.S. PATENT DOCUMENTS

| | | | |
|---|---|---|---|
| 5,342,652 | A | 8/1994 | Foster et al. |
| 5,595,784 | A | 1/1997 | Kaim et al. |
| 5,691,235 | A | 11/1997 | Meikle et al. |
| 5,711,811 | A | 1/1998 | Suntola et al. |
| 5,723,384 | A | 3/1998 | Park et al. |
| 5,820,965 | A * | 10/1998 | Pyzik et al. ............... 428/846.2 |
| 5,916,365 | A | 6/1999 | Sherman |
| 5,947,710 | A | 9/1999 | Cooper et al. |
| 6,006,763 | A | 12/1999 | Mori et al. |
| 6,015,590 | A | 1/2000 | Suntola et al. |
| 6,087,257 | A | 7/2000 | Park et al. |
| 6,099,904 | A | 8/2000 | Mak et al. |
| 6,124,158 | A | 9/2000 | Dautartas et al. |
| 6,139,624 | A | 10/2000 | Rupp |
| 6,144,060 | A | 11/2000 | Park et al. |
| 6,156,382 | A | 12/2000 | Rajagopalan et al. |
| 6,174,809 | B1 | 1/2001 | Kang et al. |
| 6,194,310 | B1 | 2/2001 | Hsu et al. |
| 6,200,893 | B1 | 3/2001 | Snef |
| 6,206,967 | B1 | 3/2001 | Mak et al. |
| 6,342,277 | B1 | 1/2002 | Sherman |
| 6,391,785 | B1 | 5/2002 | Satta et al. |
| 6,464,779 | B1 | 10/2002 | Powell et al. |
| 6,613,383 | B1 * | 9/2003 | George et al. ............... 427/212 |
| 6,632,279 | B1 | 10/2003 | Ritala et al. |
| 2001/0024387 | A1 | 9/2001 | Raaijmakers et al. |
| 2001/0034097 | A1 * | 10/2001 | Lim et al. .................... 438/253 |
| 2003/0049931 | A1 | 3/2003 | Byun et al. |
| 2003/0072975 | A1 | 4/2003 | Shero et al. |
| 2003/0082296 | A1 | 5/2003 | Elers et al. |
| 2003/0104126 | A1 | 6/2003 | Fang et al. |
| 2003/0123216 | A1 | 7/2003 | Yoon et al. |
| 2003/0127043 | A1 | 7/2003 | Lu et al. |
| 2003/0153181 | A1 | 8/2003 | Yoon et al. |
| 2003/0157760 | A1 | 8/2003 | Xi et al. |
| 2003/0161952 | A1 | 8/2003 | Wang et al. |
| 2003/0181035 | A1 | 9/2003 | Yoon et al. |
| 2003/0194825 | A1 | 10/2003 | Law et al. |
| 2003/0203616 | A1 | 10/2003 | Chung et al. |
| 2005/0271813 | A1 | 12/2005 | Kher et al. |

FOREIGN PATENT DOCUMENTS

| | | |
|---|---|---|
| JP | 58033841 | 2/1983 |
| JP | 6037041 | 2/1994 |
| JP | 8264530 A | 10/1996 |
| WO | WO 96/17107 | 6/1996 |
| WO | WO 00/40772 | 7/2000 |
| WO | WO 00/47404 | 8/2000 |
| WO | WO 00/54320 | 9/2000 |
| WO | WO 00/55895 | 9/2000 |
| WO | WO 01/29280 | 4/2001 |
| WO | WO 01/61833 | 8/2001 |

OTHER PUBLICATIONS

Jeon, H., "Study on the Characteristics of TiN Thin Film Deposited by Atomic Layer Chemical Vapor Deposition Method," *AVS 46th International Symposium*, Seattle, WA, abstract TF-MoP17 (1999).

Juppo et al., J. Vac. Sci Technology A16(5): 2845 (1998).

Klaus, J.W., et al., "Atomic layer deposition of tungsten and tungsten nitride using sequential surface reactions," *AVS 46th International Symposium*, Seattle, WA, abstract TF-TuM6 (1999).

Kukli, K. et al., Properties of $(Nb_{1-x}Ta_x)_2O_5$ Solid Solutions and $(Nb_{1-x}Ta_x)_2O_5$-$ZrO_2$ Nanolaminates Grown by Atomic Layer Epitaxy, *NanoStructured Materials*, vol. 8, No. 7, pp. 785-793 (1997).

Riihela et al., Thin Solid Films 289:250-255 (1991).

Ritala et al., "Atomic layer epitaxy growth of TiN thin films," *J. Electrochem. Soc.*, 142(8):2731-2737 (1995).

Yang et al., "Atomic Layer Deposition of Tungsten Film from WF6/B2H6: Nucleation Layer for Advanced Semiconductor Devices." Advanced Metallization Conference 2001 (AMC 2001), Conference Proceedings ULSI XVII@2002 Materials Research Society, pp. 655-660.

Ritala et al, "Controlled Growth of TaN, Ta3N5, and TaOxNy Thin Films by Atomic Layer Deposition" Chem. Mater. 1999, 11, 1712-1718.

Hiltunen et al., "Nitrides of titanium, niobium, tantalum and molybdenum grown as thin films by the atomic layer epitaxy method," *Thin Sold Films*, 166: 149-154 (1988).

Hultman et al., "Review of the Thermal and Mechanical Stability of TiN-based Thin Films" *Zeitscrift Fur Metallkunde* 90 (10): 803-813 (1999).

Ihanus et al., "ALE growth of $ZnS_{1-x}Se_x$ thin films by substituting surface sulfur with elemental selenium" *Appl. Surface Sci.*, 112:154-158 (1997).

Jeon, H. et al., "Study on the Characteristics of TiN Thin Film Deposited by Atomic Layer Chemical Vapor Deposition Method," *J. Vac. Sci. Technology. A*, 18(4) 1595-1598 (2000).

Kattelus, H. et al., "Electrical Properties of Tantalum Based Composite Oxide Films" *Mat. Res. Soc. Symp. Proc.* vol. 284, pp. 511-516 (1993).

Kattelus, H. et al., "Layered tantalum-aluminum oxide films deposited by atomic layer epitaxy," *Thin Solid Films*, vol. 225, pp. 296-298 (1993).

Kim, Y.K. et al., "Novel capacitor technology for high density stand-alone and embedded DRAMs," *IEEE International Electron Devices Meeting*, IEDM (2000).

Klaus, J. W. et al., "Atomic layer deposition of tungsten nitride films using sequential surface reactions," *Journal of the Electrochemical Soc.*, 147 (3):1175-1181 (2000).

Klaus, J. W. et al., "Atomic layer deposition of tungsten using sequential surface chemistry with a sacrificial stripping reaction," *Thin Solid Films*, 360: 145-153 (2000).

Klaus, J. W. et al., "Atomically controlled growth of tungsten and tungsten nitride using sequential surface reactions," *Applied Surface Science* 162-163; 479-491 (2000).

Kukli et al. "Properties of atomic layer deposited $(Ta_{1-x}Nb_x)_2O_5$ solid solution films and $Ta_2O_5$-$Nb_2O_5$ nanolaminates" *J. Appl. Phys.*, 86 (10):5656-5662 (1999).

Lakomaa, E-L. et al., "Surface reactions in $Al_2O_3$ growth from trimethylaluminum and water by atomic layer epitaxy," *Applied Surface Science*, vol. 107, pp. 107-115 (1996).

Ritala, M. et al., "Surface roughness reduction in atomic layer epitaxy growth of titanium dioxide thin films," *Thin Solid Films*, vol. 249, pp. 155-162 (1994).

Zhang, H. et al., "High permittivity thin film nanolaminates," *Journal of Applied Physics*, vol. 87, No. 4, pp. 1921-1924 (2000).

Office Action from U.S. Appl. No. 10/969,297 dated Apr. 4, 2007.

* cited by examiner

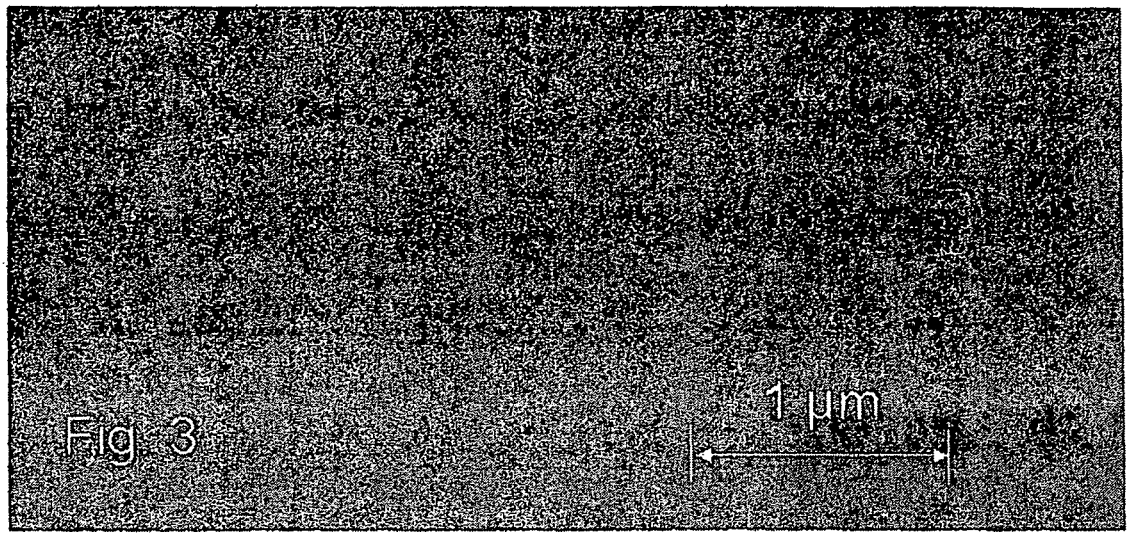
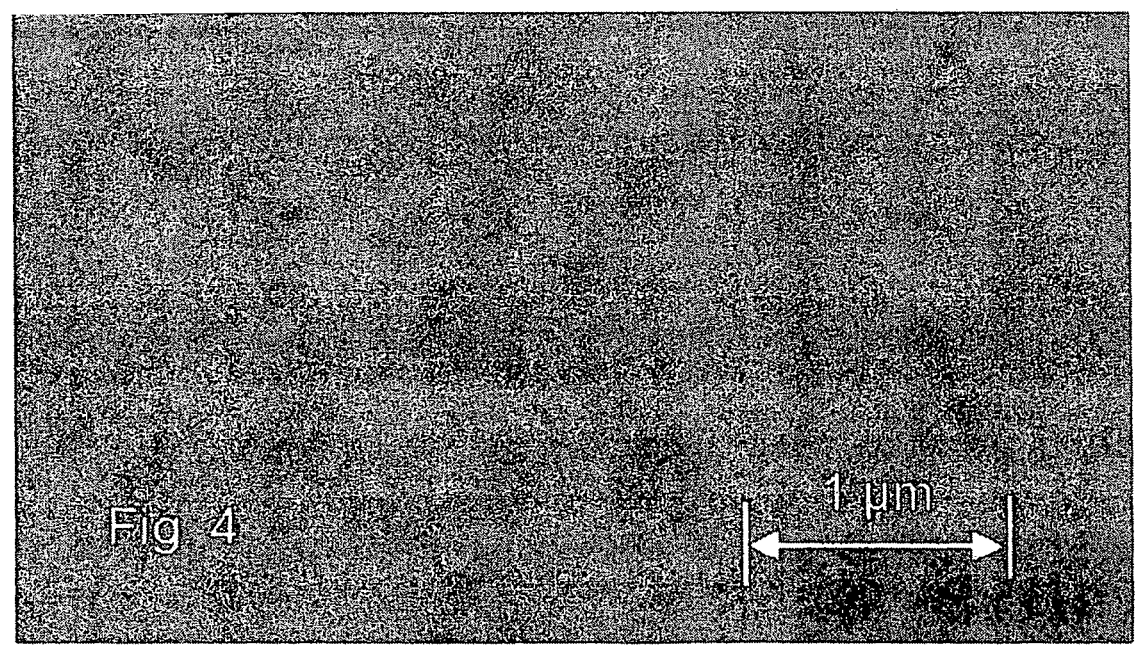

| Metal | fluoride | chloride | bromide | iodide |
|---|---|---|---|---|
| Titanium (Ti) | X | X | X | X |
| Zirconium (Zr) | X | X | X | X |
| Hafnium (Hf) | X | X | O | X |
| Vanadium (V) | X | X | X | X |
| Niobium (Nb) | O | X | X | X |
| Tantalum (Ta) | O | X | X | X |
| Chromium (Cr) | X | X | X | X |
| Molybdenum (Mo) | X | X | X | X |
| Tungsten (W) | X | X | X | (X) |

| |
|---|
| Thin film layer 4: $WF_6/N_2/NH_3/N_2 \dashrightarrow W_xN_y$ |
| Thin film layer 3: $TiCl_4/N_2/NH_3/N_2 \dashrightarrow Ti_xN_y$ |
| Thin film layer 2: $WF_6/N_2/NH_3/N_2 \dashrightarrow W_xN_y$ |
| Thin film layer 1: $TiCl_6/N_2/NH_3/N_2 \dashrightarrow Ti_aN_b$ |
| $SiO_2$ (native oxide) |
| Substrate (single-ctrystal silicon) |

FIG. 9

METHOD FOR DEPOSITING NANOLAMINATE THIN FILMS ON SENSITIVE SURFACES

CROSS-REFERENCE TO RELATED APPLICATIONS

The present application is a continuation of U.S. application Ser. No. 10/969,297, filed Oct. 19, 2004, now U.S. Pat. No. 7,329,590, which is a divisional of U.S. application Ser. No. 10/049,125, filed Aug. 20, 2002, now U.S. Pat. No. 6,902,763. U.S. application Ser. No. 10/049,125 is, in turn, the U.S. national phase of PCT application no. PCT/US00/28654 filed Oct. 16, 2000. The present application claims priority under 35 U.S.C §119 to U.S Provisional Application Nos. 60/159,799, filed Oct. 15, 1999 and 60/176,984, filed Jan. 18, 2000. The present application also claims priority to Finnish patent application numbers FI19992233, filed Oct. 15, 1999, FI19992234, filed Oct. 15, 1999, FI19992235, filed Oct. 5, 1999 and FI20000564, filed Mar. 10, 2000. Each of the priority applications is hereby incorporated by reference.

BACKGROUND OF THE INVENTION

1. Field of the Invention

The present invention relates generally to depositing thin films on substrates by alternated self-saturating chemistries. More particularly, the present invention relates to preventing the corrosion of materials in a substrate while employing corrosive species during the formation of thin films.

2. Background of the Invention

Atomic Layer Deposition (ALD), originally known as Atomic Layer Epitaxy (ALE), is an advanced variation of CVD. ALD processes are based on sequential self-saturated surface reactions. Examples of these processes are described in detail in U.S. Pat. Nos. 4,058,430 and 5,711,811. The described deposition processes benefit from the usage of inert carrier and purging gases, which make the system fast. Due to the self-saturating nature of the process, ALD enables almost perfectly conformal deposition of films on an atomically thin level.

The technology was initially developed for conformal coating of substrates for flat panel electroluminescent displays that desirably exhibited high surface area. More recently, ALD has found application in the fabrication of integrated circuits. The the increasingly scaled-down dimensions demanded of state-of-the-art semiconductor processing.

While ALD has many potential applications to semiconductor fabrication, integrating these new processes into established process flows can introduce many new issues. Accordingly, a need exists for improved ALD processes.

SUMMARY OF THE INVENTION

In accordance with one aspect of the invention, a method is provided for forming a nanolaminate structure on a substrate within a reaction space by an atomic layer deposition (ALD) type process. The nanolaminate structure has at least two adjacent thin film layers, including at least one metal compound layer. Each thin film layer is in a different phase from adjacent thin film layers.

In accordance with another aspect of the invention, a nanolaminate structure is provide with at least three thin film layers. Each layer has a thickness less than about 10 nm. At least one of the layers selected from the group consisting of metal carbides and metal nitrides.

In accordance with another aspect of the invention, a method is provided for depositing a material on a substrate in a reaction space. The substrate has a surface susceptible to halide attack. The method includes providing alternated pulses of reactants in a plurality of deposition cycles, where each cycle includes:

supplying a first reactant to chemisorb no more than about one monolayer of a halide-terminated species over the surface;

removing excess first reactant and reaction by-product from the reaction space; and gettering halides from the monolayer prior to repeating the cycle

BRIEF DESCRIPTION OF THE DRAWINGS

These and other aspects of the invention will be readily apparent to the skilled artisan in view of the description below and the appended drawings, which are meant to illustrate and not to limit the invention, and in which:

FIG. 3 is as SEM taken from a PVD copper covered first with WN and then with TiN in accordance with a preferred embodiment of the present invention (Example 6).

FIG. 4 is an SEM taken from an electrochemically deposited (ECD) copper covered first with WN and then with TiN, in accordance with a preferred embodiment of the present invention (Example 6).

FIG. 9 is a schematic diagram of the first four thin film layers of an ALD nitride nanolaminate and the pulsing sequence for each thin film layer.

DETAILED DESCRIPTION OF THE PREFERRED EMBODIMENT

Figure 1:
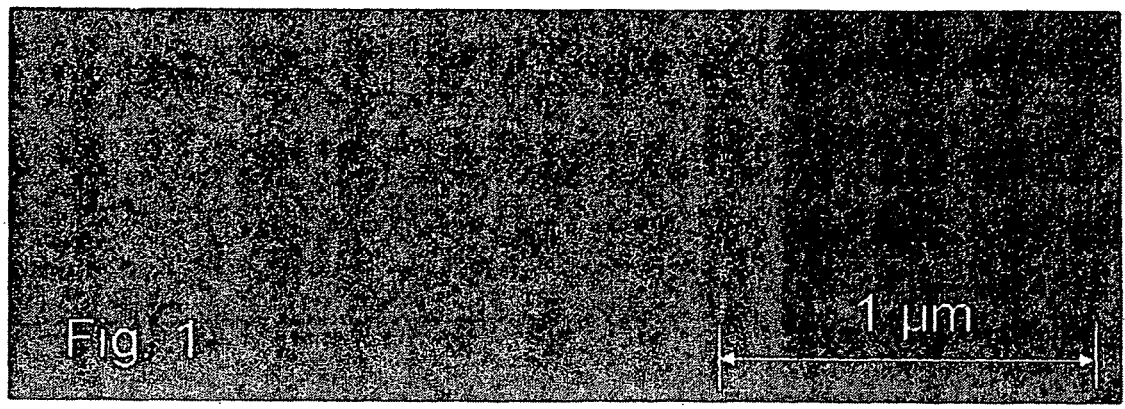
FIG. 1 is a Scanning Electron Micrograph (SEM) taken from a copper film formed by physical vapor deposited (PVD). The measurement voltage was 10 kV.

The present disclosure teaches methods for protecting sensitive surfaces during ALD deposition. The skilled artisan will appreciate that, while applicable to nanolaminate construction, the protection of sensitive surfaces from corrosion has application in other contexts, and vice versa.

DEFINITIONS

For the purpose of the present description, an "ALD process" designates a process in which deposition of material onto a surface is based on sequential and alternating self-saturating surface reactions. The general principles of ALD are disclosed, e.g., in U.S. Pat. Nos. 4,058,430 and 5,711,811, the disclosures of which are incorporated herein by reference.

"Reaction space" is used to designate a reactor or reaction chamber, or an arbitrarily defined volume therein, in which conditions can be adjusted to effect thin film growth by ALD.

"Adsorption" is used to designate an attachment of atoms or molecules on a surface.

"Surface" is used to designate a boundary between the reaction space and a feature of a substrate.

"Getter," "gettering agent" or "scavenger" is used to designate a volatile species that can form new volatile compounds from halogen or halide species adsorbed on the surface, or from halides in the reaction space (e.g., hydrogen halides or ammonium halides). Typically, the new halogen compounds are less corrosive to exposed features of the workpiece than are hydrogen halides or ammonium halides.

The symbols "–" and "=" attached with one end to an atom designate the number of bonds to unspecified atoms or ions.

A subscript "x" in metal nitrides (e.g., $WN_x$ or $TiN_x$) is used to designate the transition metal nitrides that are not necessarily stoichiometric, having a wide range of phases with varying metal/nitrogen ratios.

A subscript "x" in metal carbides (e.g., $WC_x$ or $TiN_x$) is used to designate the transition metal carbides that are not necessarily stoichiometric, having a wide range of phases with varying metal/carbon ratios.

"Nanolaminate structure" means a layered structure comprising stacked thin film layers of different phases with respect to the growth direction of the nanolaminate. "Alternating" or "stacked" means that the adjacent thin film layers differ from each other. In a nanolaminate structure there are always at least two phases of molecules. Preferably, at least three adjacent phases are present. A single phase exists where the molecules or atoms in a space are so evenly mixed that no differences can be found between different parts of the space by analytical methods. Different phases can be due to any differences recognized in the art, for example different crystal structures, crystallite lattice parameters, crystallization stage, electrical conductivity and/or chemical composition of the thin film on either side of the phase interface.

Desirably, each phase or layer in the stack is thin, preferably less than about 20 nm in thickness, more preferably less than about 10 nm and most preferably less than about 5 nm each. "Thin film" means a film that is grown from elements or compounds that are transported as separate ions, atoms or molecules via vacuum, gaseous phase or liquid phase from the source to the substrate. The thickness of the film depends upon the application and may vary in a wide range, preferably from one atomic layer to 1,000 nm.

"Metal thin film" designates a thin film that consists essentially of metal. Depending on the reducing agent the metal thin film may contain some metal carbide and/or metal boride in an amount that does not have a negative effect on the characteristic metal properties of the film, or the characteristic properties of a nanolaminate.

Integration Issues

Halides generally, and particularly transition metal halides, are attractive source chemicals for ALD due to their high volatility and durability against thermal decomposition. Of these halides, compounds that are liquids or gases near room temperature, such as $TiCl_4$ and $WF_6$, are preferred because they do not generate solid particles at the source container. In addition to their volatility, many such halide compounds are particularly useful for ALD processing because they allow chemisorption of a species of interest (e.g., a metal-containing species), leaving no more than a monolayer of the species terminated with halide tails. The halide tails prevent further chemisorption or reaction of the species of interest, such that the process is self-saturating and self-limiting.

Figure 2:
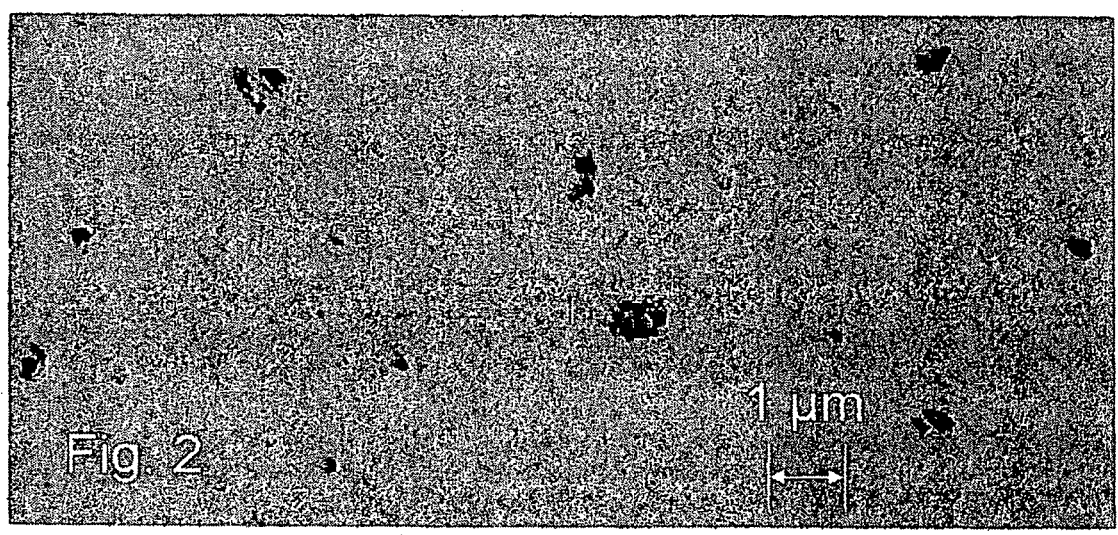
FIG. 2 is an SEM taken from a PVD copper covered with TiN in accordance with an ALD process that did not employ a getter or scavenger pulse. The black areas of the picture indicate areas of the copper etched during the TiN processing.

Metal halides can be employed, for example, in the formation of metal, metal nitride and metal carbide thin films by ALD processes. However, these processes have not resulted in the perfectly conformal deposition desired of ALD. FIG. 2 and the discussion of Examples 1, 2 and 4 demonstrate, for example, corrosive damage sustained by "exposed" copper during ALD formation of metal nitrides and carbides using metal halides alternated with ammonia. In fact, Example 4 demonstrates that such damage can be sustained even when the copper was covered by 5 nm of tungsten metal.

ALD processes using metal halides and source chemicals with high hydrogen content, can release hydrogen halides (e.g., HF, HCl) as reaction by-products. These reactive by-products can destroy certain metal surfaces, leaving deep pits in the metal or even removing all the metal. Silicon dioxide is also prone to corrosion due to the formation of volatile silicon halides. These hydrogen halides can also combine with other reactants during an ALD phase, such as with excess $NH_3$ during a nitrogen phase, to form additional harmful species, such as ammonium halides (e.g., $NH_4F$) that exacerbate the corrosion problem. Thus, by-products from alternating halide- and hydrogen-bearing reactants tend to corrode exposed materials of a partially fabricated integrated circuit, like aluminum, copper and silicon dioxide.

Preferred Workpiece

The preferred embodiments involve deposition of metal, metal carbide and metal nitride thin films by ALD upon the surface of a substrate. In one embodiment the thin films form nanolaminates. More particularly, the embodiments involve deposition upon "sensitive" surfaces that are susceptible to corrosion in the presence of halides and especially hydrogen halides. Such sensitive surfaces include, for example, metals such as aluminum and copper, as well as silicon compounds such as silicon oxide and silicon nitride.

As set forth in more detail below, such sensitive surfaces are generally characterized as having negative or near zero Gibb's free energy ($\Delta G_f$) for reactions between the surfaces and hydrogen halides or ammonium halides.

Figure 6:
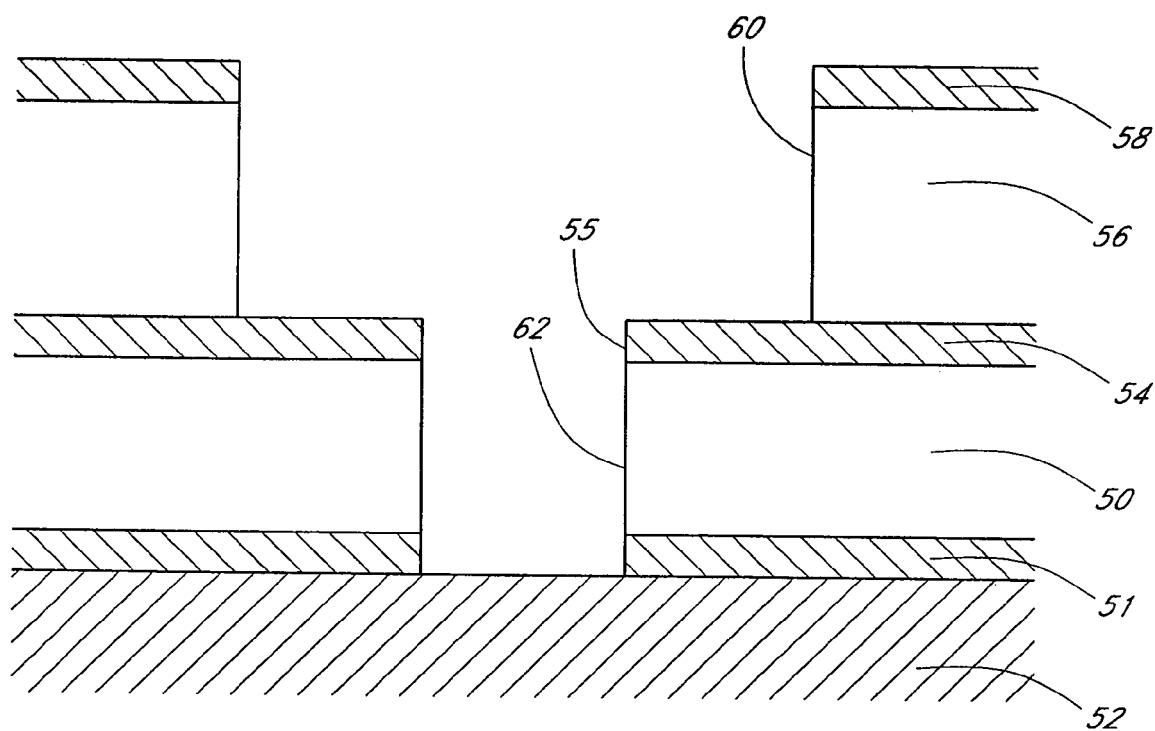
FIG. 6 is a schematic cross-section of an exemplary workpiece over which metal or metal compound deposition is desired, consisting of a dual damascene structure in a partially fabricated integrated circuit, having copper and insulating oxide surfaces exposed.

FIG. 6 illustrates a dual damascene context in which deposition is desired over a plurality of such materials simultaneously. The structure includes a first or lower insulating layer 50, a form of silicon oxide, particularly deposited by plasma enhanced CVD (PECVD) employing tetraethylorthosilicate (TEOS) a precursor. The insulating layer 50 is formed over a barrier layer 51 (typically silicon nitride), which in turn overlies a conductive element 52. The conductive element 52 in a dual damascene context typically comprises a highly conductive wiring metal and most preferably comprises copper. Over the first insulating layer 50 is an etch stop 54 formed of a material with a significantly different etch rate compared to the underlying insulator 50. The etch stop layer 54 (typically silicon nitride) includes a plurality of openings 55 across the workpiece to serve as hard mask in defining contact vias. A second or upper insulating layer 56 (also PECVD TEOS) is formed over the etch stop 54, and a polishing shield 58 to stop a later chemical mechanical planarizing (CMP) step. The polishing shield 58 typically comprises a relatively hard material, such as silicon nitride or silicon oxynitride.

As will be appreciated by the skilled artisan, the dual damascene structure is formed by photolithography and etch steps to define a plurality of trenches 60 with contact vias 62 extending from the trench floors at discrete locations. The trenches 60 serve to define wiring patterns for interconnection of electrical devices according to an integrated circuit design. The contact vias 62 define locations where electrical connection to lower electrical elements or wiring layers are desired in accordance with the circuit design.

The skilled artisan will appreciate that various alternative materials and structures can be employed to accomplish these ends. For example, while the preferred insulating layers 50, 56 comprise PECVD TEOS, in other arrangements the material of these layers can comprise any of a number of other suitable dielectric materials. For example, dielectric materials have recently been developed that exhibit low permittivity (low k), as compared to conventional oxides. These low k dielectric materials include polymeric materials, porous materials and fluorine-doped oxides. Similarly, the barrier 51, etch stop 54 and shield 58 can comprise any of a number of other materials suitable to their prescribed function. Moreover, any or all of the layers 51, 54 and 58 can be omitted in other schemes for producing dual damascene structures.

Figure 7:
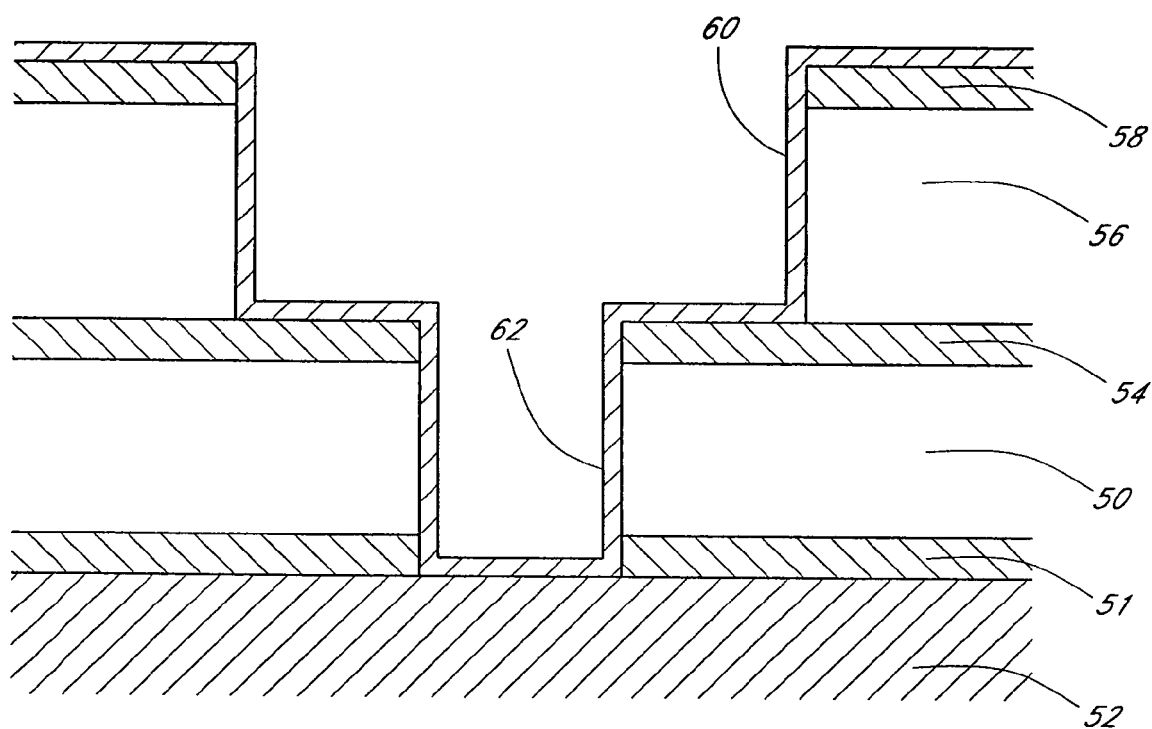
FIG. 7 illustrates the workpiece of FIG. 6 after lining the dual damascene trench and contact via with a conformal thin film in accordance with the preferred embodiments.

As shown in FIG. 7, the dual damascene trenches 60 and vias 62 are then lined with a thin film 150. The thin film 150 can be formed selectively over particular desired surfaces of the structure, but is most preferably formed in a blanket, conformal deposition by ALD, in accordance with the preferred embodiments. In the illustrated embodiment, the thin film is conductive, allowing electrical signals to flow therethrough.

Integrated circuits contain interconnects that are usually made of aluminum. Recently, copper has become an attractive material in the field. Copper is, however, prone to diffusion to surrounding materials. Diffusion affects the electrical properties of the circuits and may cause active components to malfunction. Diffusion may be prevented by an electrically conductive diffusion barrier layer. Amorphous films are believed to enhance the properties of diffusion barriers because the ion diffusion favors the grain boundaries of the thin films. Favored diffusion barriers are transition metal nitrides, such as $TiN_x$, $TaN_x$ and $WN_x$. The inventors have also found metal carbides (e.g., $WC_x$) to be good, conductive diffusion barriers.

Conventionally, a thin lining film in a dual damascene structure includes a conductive adhesion sub-layer (e.g., tungsten metal), a barrier sub-layer (e.g., titanium nitride) and a seed sub-layer (e.g., PVD copper). The preferred thin film 150 can comprise one or more of these sub-layers, formed by ALD, and can also comprise one or more sub-layers formed by other methods. The preferred embodiments, for example, include a method of forming tungsten metal by ALD over oxide and copper structures without etching. However, it is generally desirable to minimize the thickness of lining layers, to thereby maximize the volume of the structure occupied by a later-deposited highly conductive metal (preferably copper). To this end, the preferred embodiments also provide means for depositing barrier layers directly over both oxide and copper surfaces (or other sensitive surfaces) without etching the sensitive surfaces, or depositing barrier layers over extremely thin adhesion layers without corrosion.

As will be appreciated by the skilled artisan, following formation of the thin film 150, the trench 60 and via 62 can be filled with a highly conductive material, such as electroplated copper. A polishing step then ensures individual lines are isolated within the trenches 60.

Nanolaminate Structures

Nanolaminates are layered structures that have enhanced diffusion barrier properties. A nanolaminate consists of multiple thin film and is constructed so as to create very complicated diffusion paths for impurities through disruption of normal crystal growth during deposition. Thus, nanolaminates comprise alternating thin film layers of different phases, for example with different crystallite structures and different crystallite lattice parameters.

According to a preferred embodiment of the invention, nanolaminate structures are formed on the substrate. The nanolaminate structures preferably are comprised of at least one transition metal compound thin film layer, desirably conductive and serving a diffusion barrier function. The metal compound can be a metal nitride or a metal carbide. The nanolaminate structures may also comprise one or more elemental metal thin film layers.

The nanolaminate structures are preferably layered structures, comprising alternating, stacked thin film layers of materials with different phases with respect to the growth direction of the nanolaminate. The nanolaminate structures preferably comprise materials with at least two different phases. Thus, at least two adjacent thin film layers preferably have a different phase. For example they may have a structure, composition or electrical resistivity different from each other. In a nanolaminate with three layers, at least one of the layers will preferably have a phase different from the other two layers.

The nanolaminate structures preferably comprise at least two thin film layers. More preferably they comprise at least three thin film layers. When the nanolaminate structure comprises three film layers, it is preferably a "sandwich" structure wherein the middle layer has a different phase from the outer two layers.

Preferably, the nanolaminates are grown such that the phase alternates with the layers. Thus, every other layer preferably is of the same phase. However, all of the thin films of one nanolaminate structure can be of different phases, for example if each thin film layer is made of different materials. This structure has a number of phase interfaces that may impair the diffusion of ions in the structure.

An example of a nanolaminate structure is presented in FIG. 9, which is a schematic diagram of the first four thin film layers of a metal nitride nanolaminate produced by the ALD type process of the present invention. The pulsing sequence for obtaining each layer is indicated in FIG. 9. The layers are not to scale in the figure and the subscripts x, y, a and b are integers.

Figure 10:
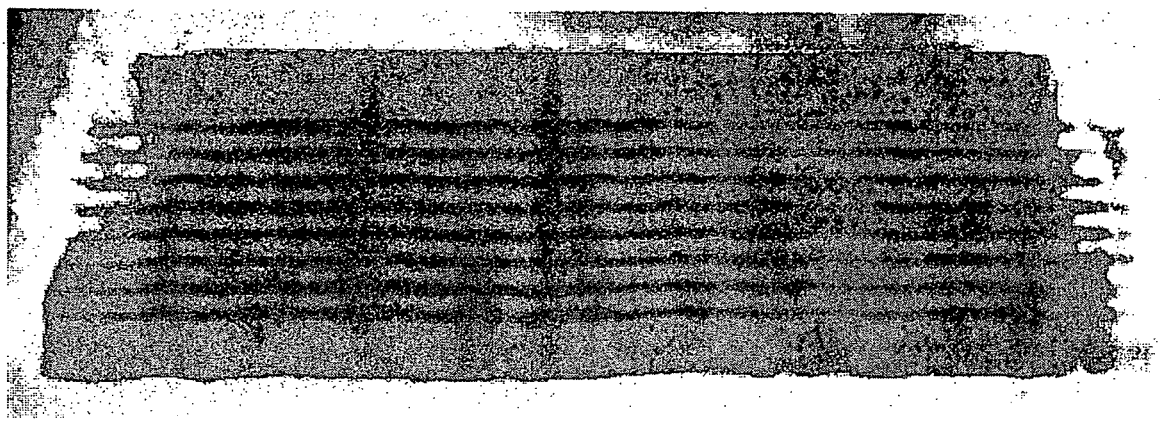
FIG. 10 is a transmission electron microscopy (TEM) picture of a nitride nanolaminate structure.

FIG. 10 illustrates the uniform growth and sharp interfaces between layers in the preferred nanolaminates. FIG. 10 is a transmission electron microscopy (TEM) picture of a nitride nanolaminate structure showing clearly separated 1.8 nm thin film layers of titanium nitride 30 (light grey) and 4.5 nm thin film layers of tungsten nitride 40 (dark grey).

The number of layers stacked in a nanolaminate structure may vary, but can vary from 2 to 500, preferably from 3 to 300, more preferably from 4 to 250 and even more preferably from 4 to 20. The thickness of a nanolaminate structure is preferably from 2 molecular layers to 1,000 nm, more preferably from 5 nm to 200 nm and even more preferably from 10 nm to 100 nm. Desirably, each layer is thin, preferably less than 20 nm in thickness, more preferably less than about 10 nm, and most preferably less than about 5 nm each.

The thin film layers that make up the nanolaminate structures of the present invention preferably have different phases or properties from each adjacent layer. These differences may be in the following properties, but one skilled in the art will recognize that other properties are contemplated and that the properties will vary depending upon the types of thin films in the nanolaminate structure:

1. Crystallite structure. The crystallite structure varies according to the deposited species, as well as according to the metal/nitrogen ratio of nitride thin film layers. The variation in crystallite structure can occur in a number of details, including the space group, unit cell dimensions and orientation of the crystallites on the thin film layer.

There are 230 space groups, such as face centered, cubic and hexagonal. Thus, a nanolaminate structure can be made by depositing on a substrate alternating thin film layers having hexagonal and cubic space groups of the crystallite, respectively. Variation in the space group can change the unit cell dimensions.

Unit cell is the smallest repeated atomic arrangement inside the crystallite, and the size of a unit cell can vary. As an example, a nanolaminate can be made by depositing alternating thin film layers comprising materials with a small unit cell and a big unit cell.

The orientation of the crystallites on the thin film layer according to the Miller indices may also vary. For example, a nanolaminate may have the following structure: (100)/(111)/(100)/(111)/...

2. Composition. Composition refers to atomic make-up, such as the metal/nitrogen ratio in the illustrated nanolaminates that include metal nitride, or the metal/carbon ratio in the illustrated nanolaminates that include metal carbide. An example of a nanolaminate structure comprising different phases due to the metal/nitrogen ratio is the following: $Ta_3N_5$/TaN/$Ta_3N_5$/TaN/... Another example is a structure wherein some thin film layers contain nitrogen and others do not, such as W/WN/W/WN/...

3. Electrical Resistivity. Electrical resistivity also varies according to the metal/nitrogen ratio. Amorphous or near-amorphous structures may have clearly different resistivities when compared to each other. In general the more nitrogen is present in a thin film layer, the higher the resistivity. An example of a possible nanolaminate structure is one comprising alternating thin film layers of materials with low resistivity and very low resistivity.

The nanolaminates of the present invention can be used, for example, as diffusion barriers in integrated circuits. They can also be used as a reflector for x-rays. The nanolaminate structure suitable for such an application preferably comprises thin film layers consisting of high atomic number transition metals or high atomic number transition metal nitrides and low atomic number elements or nitrides. In the context of the present invention the atomic number is considered to be "high" if it is at least approximately 15 or greater and "low" if it is approximately 14 or less. The high atomic number nitrides are preferably prepared using a source material comprising tungsten or tantalum. The low atomic number nitrides are preferably inorganic nitrides, particularly beryllium, boron, magnesium, aluminum and silicon nitrides. Preferably the thin film layers are arranged in the nanolaminate such that layers comprising a high atomic number nitride are alternated with layers comprising a low atomic number nitride.

The nanolaminate structures described herein, including metal nitride or carbide on other conductive barrier layers, are particularly suitable for interconnect barriers, as described with respect to FIG. 7. Moreover, these materials are sensitive to attack from hydrogen halides and ammonium halides in the process of deposition. Accordingly, the methods of deposition described below enable quality nanolaminate structures.

Preferred ALD Methods

The methods presented herein allow deposition of conformal thin films and nanolaminates from aggressive chemicals on chemically sensitive surfaces. Geometrically challenging applications are possible due to the use of self-limited surface reactions.

According to the preferred embodiments, thin films, particularly nanolaminate structures, are formed by an Atomic Layer Deposition (ALD) type process on integrated circuit workpieces or substrates that include surfaces susceptible to halide attack. Such sensitive surfaces can take a variety of forms. Examples include silicon, silicon oxide ($SiO_2$), coated silicon, low-k materials, metals such as copper and aluminum, metal alloys, metal oxides and various nitrides, such as transition metal nitrides and silicon nitride or a combination of said materials. As noted above with respect to FIGS. 6 and 7, the preferred damascene and dual damascene contexts include silicon oxide based insulators and exposed copper lines at the bottom of contact vias.

A substrate or workpiece placed in a reaction chamber is subjected to alternately repeated surface reactions of source chemicals for the purpose of growing a thin film. In particular, thin films are formed by a periodic process in which each cycle deposits, reacts or adsorbs a layer upon the workpiece in a self-limiting manner. Preferably, each cycle comprises at least two distinct phases, wherein each phase is a saturative reaction with a self-limiting effect. Reactants are thus selected such that, under the preferred conditions, the amount of reactants that can be bound to the surface is determined by the number of available sites and incidentally by the physical size of chemisorbed species (including ligands). The layer left by a pulse is self-terminated with a surface that is non-reactive with the remaining chemistry of that pulse. This phenomenon is referred to herein as "self-saturation".

Maximum step coverage on the workpiece surface is obtained when no more than about a single molecular layer of source chemical molecules is chemisorbed in each pulse. Each subsequent pulse reacts with the surface left by the preceding pulse in a similarly self-limiting or self-terminating manner. The pulsing sequence is repeated until a thin film of the desired thickness, or a nanolaminate with the desired structure is grown.

In accordance with the preferred embodiments, the reactants of the pulses are selected to avoid etch damage to the workpiece surfaces. Example 8 below gives one embodiment in which the reactants do not significantly etch the surfaces.

More preferably, the reactants include species that are harmful to the substrate. However, a getter phase during each ALD cycle scavenges harmful species, thereby protecting sensitive surfaces while still enabling employment of advantageous volatile reactants that are conducive to self-saturation in each phase. Examples 3, and 5-7, for instance, disclose deposition processes that include a scavenging or gettering phase during each cycle. In the case of metal thin film deposition (Example 3), at least two different source chemicals are alternately employed, one of which getters halides from the other chemical. In the case of metal nitride thin film deposition (Examples 5-7), at least three different source chemicals are alternatively employed: a first reactant that forms no more than about one monolayer terminated with halogen ligands and including a species desired in the layer being deposited; a getter for scavenging halides from the monolayer; and a second reactant that contains another species desired in the layer being deposited, particularly nitrogen.

Figure 8:
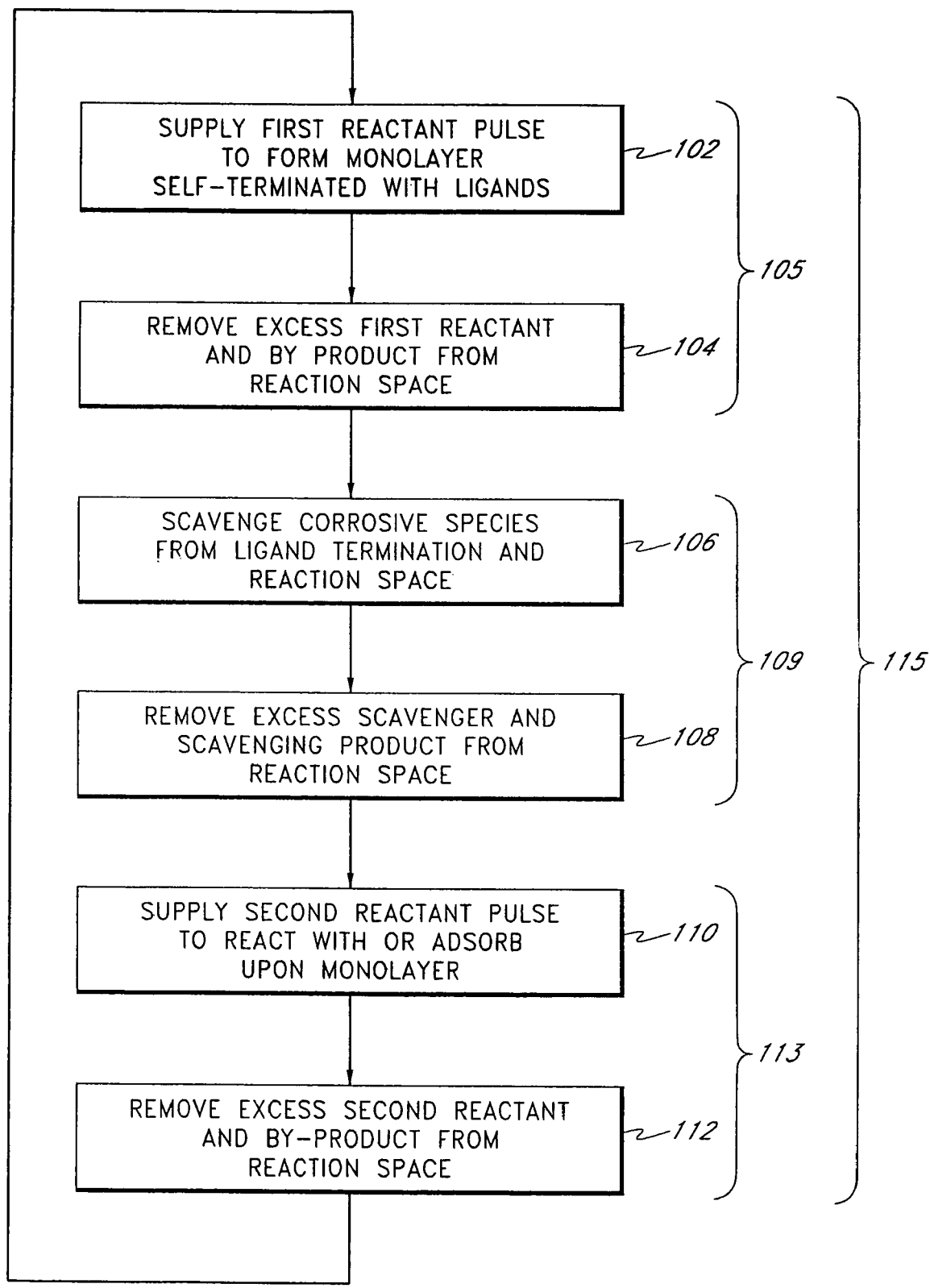
FIG. 8 is a flow chart generally illustrating a method of forming a binary compound by Atomic Layer Deposition (ALD), in accordance with several of the preferred embodiments.

FIG. 8 illustrates generally a three-phase cycle for depositing binary materials. The skilled artisan will readily appreciate, however, that the principles disclosed here can be readily applied to depositing ternary or more complex materials by ALD.

The semiconductor workpiece that includes sensitive surfaces is loaded into a semiconductor processing reactor. An exemplary reactor, designed specifically to enhance ALD processes, is commercially available from ASM Microchemistry of Finland under the tradename Pulsar 2000™.

If necessary, the exposed surfaces of the workpiece (e.g., the trench and via sidewall surfaces and the metal floor shown in FIG. 6) are terminated to react with the first phase of the ALD process. The first phases of the preferred embodiments are reactive, for example, with hydroxyl (OH) or ammonia ($NH_3$) termination. In the examples discussed below, silicon oxide and silicon nitride surfaces of the dual damascene structure do not require a separate termination. Certain metal surfaces, such as at the bottom of the via 61 (FIG. 9A), can be terminated, for example, with ammonia treatment.

After initial surface termination, if necessary, a first reactant pulse is then supplied 102 to the workpiece. In accordance with the preferred embodiments, the first reactant pulse comprises a carrier gas flow and a volatile halide species that is reactive with the workpiece surfaces of interest and further includes a species that is to form part of the deposited layer. Accordingly, a halogen-containing species adsorbs upon the workpiece surfaces. In the illustrated embodiments, the first reactant is a metal halide, and the thin film being formed comprises a metallic material, preferably metal nitride. The first reactant pulse self-saturates the workpiece surfaces such that any excess constituents of the first reactant pulse do not further react with the monolayer formed by this process. Self-saturation results due to halide tails terminating the monolayer, protecting the layer from further reaction.

The first reactant pulse is preferably supplied in gaseous form, and is accordingly referred to as a halide source gas. In some cases, the reactive species can have a melting point above the process temperature (e.g., CuCl melts at 430° C. while the process is conducted at about 350° C.). Nevertheless, the halide source gas is considered "volatile," for purposes of the present description, if the species exhibits sufficient vapor pressure under the process conditions to transport the species to the workpiece in sufficient concentration to saturate exposed surfaces.

The first reactant is then removed 104 from the reaction space. Preferably, step 104 merely entails stopping the flow of the first chemistry while continuing to flow a carrier gas for a sufficient time to diffuse or purge excess reactants and reactant by-products from the reaction space, preferably with greater than about two reaction chamber volumes of the purge gas, more preferably with greater than about three chamber volumes. In the illustrated embodiment, the removal 102 comprises continuing to flow purge gas for between about 0.1 seconds and 20 seconds after stopping the flow of the first reactant pulse. Inter-pulse purging is described in co-pending U.S. patent application having Ser. No. 09/392,371, filed Sep. 8, 1999 and entitled IMPROVED APPARATUS AND METHOD FOR GROWTH OF A THIN FILM, the disclosure of which is incorporated herein by reference. In other arrangements, the chamber may be completely evacuated between alternating chemistries. See, for example, PCT publication number WO 96/17107, published Jun. 6, 1996, entitled METHOD AND APPARATUS FOR GROWING THIN FILMS, the disclosure of which is incorporated herein by reference. Together, the adsorption 102 and reactant removal 104 represent a first phase 105 in an ALD cycle. The first phase can also be referred to as a halide phase.

When the reactants of the first reactant pulse have been removed 104 from the chamber, a getter pulse is supplied to the workpiece. The getter pulse scavenges or removes 106 (e.g., by ligand-exchange, sublimation or reduction) the ligand termination of the adsorbed complex monolayer formed in step 102. A getter species, preferably along with a carrier flow, saturates the workpiece surfaces to ensure removal of halide tails prior to further pulses. Temperature and pressure conditions are preferably arranged to avoid diffusion of the getter through the monolayer to underlying materials.

As will be better understood from the more detailed discussion below, reaction between the halide tails on the adsorbed monolayer and the getter species is thermodynamically favored. More particularly, reaction between the getter and the halide-terminated monolayer is generally characterized by a negative Gibb's free energy. Halide species thus bind to the getter species (or to a reaction by-product thereof, in the case of scavenging by ligand-exchange) more readily than to the remainder of the adsorbed complex formed in the first phase 105. Similarly, the getter may bind free halides in the reaction space.

The getter-halide complex (desirably also volatile) is then also removed 108 from the reaction space, preferably by a purge gas pulse. The removal can be as described for step 104. Together, the scavenger pulse 106 and removal 108 represent a second phase 109 of the illustrated ALD process, which can also be referred to as a scavenger or getter phase.

The first two phases are sufficient for the formation of metal films, such as a metal film layer in a nanolaminate structure. However, for the formation of binary metal layers, such as metal nitride layers, one additional phase is preferably employed. In other arrangements, the getter can leave a component in place of the halide. For example, a triethyl boron getter can leave carbon when scavenging fluorine from a tungsten complex.

In the illustrated embodiment, a second reactant pulse is then supplied 110 to the workpiece. The second chemistry desirably reacts with or adsorbs upon the monolayer left by the getter phase 109. The getter phase is particularly useful when the second reactant comprises a hydrogen-bearing compound, such as tends to form hydrogen halides. In the illustrated embodiments, this second reactant pulse 110 comprises supplying a carrier gas with a hydrogen-bearing nitrogen (e.g., $NH_3$) source gas to the workpiece. Nitrogen or nitrogen-containing species from the second reactant preferably reacts with the previously adsorbed monolayer to leave a nitrogen compound. In particular, where the first reactant comprises a metal halide, the second reactant leaves no more than about a monolayer of metal nitride. The second reactant pulse 110 also leaves a surface termination that operates to limit the deposition in a saturative reaction phase. Nitrogen and $NH_x$ tails terminating a metal nitride monolayer are non-reactive with $NH_3$ of the second reactant pulse.

After a time period sufficient to completely saturate and react the monolayer with the second reactant pulse 110, the second reactant is removed 112 from the workpiece. As with the removal 104 of the first reactant and removal 108 of the getter species, this step 112 preferably comprises stopping the flow of the second chemistry and continuing to flow carrier gas for a time period sufficient for excess reactants and reaction by-products from the second reactant pulse to diffuse out of and be purged from the reaction space. Together, the second reactant pulse 110 and removal 112 represent a third phase 113 in the illustrated process, and can also be considered a nitrogen or hydrogen phase, since nitrogen reacts with and forms a part of the growing film while hydrogen is released in the reaction.

In the illustrated embodiment, where three phases are alternated, once the excess reactants and by-products of the second chemistry have been removed from the reaction space, the first phase of the ALD process is repeated. Accordingly, again supplying 102 the first reactant pulse to the workpiece forms another self-terminating monolayer.

The three phases 105, 109, 113 thus together represent one cycle 115, which is repeated to form metal nitride monolayers in an ALD process. The first reactant pulse 102 generally reacts with the termination left by the second reactant pulse 110 in the previous cycle. This cycle 115 is repeated a sufficient number of times to produce a film of a thickness sufficient to perform its desired function.

Though illustrated in FIG. 8 with only first and second reactants, along with an intermediate getter phase, it will be understood that, in other arrangements, additional chemistries can also be included in each cycle. For example, if necessary, the cycle 115 can be extended to include a distinct surface preparation. Moreover, a second getter phase can be conducted in each cycle after the nitrogen phase 112. The cycle 115 then continues through steps 102 to 112. Furthermore, though illustrated with an initial metal phase and subsequent nitrogen phase in the examples below, it will be understood that the cycle can begin with the nitrogen phase, depending upon the exposed substrate surfaces and phase chemistries.

In the production of nanolaminates, after the first monolayer of metal, metal carbide or metal nitride is deposited, the starting materials, pulsing parameters and cycle are preferably changed such that the phase of the next monolayer is different and a phase interface is formed between any two film layers. For example, alternating a two phase and three phase cycle would produce a nanolaminate structure with alternating metal and metal nitride layers. In another example, the metal source chemical is alternated in each repetition of the three phase cycle, producing alternating layers of metal nitrides.

In the illustrated metal nitride embodiments (Examples 5-7), the first reactant comprises a metal halide, supplying metal to the growing layer (e.g., $WF_6$ or $TiCl_4$); the getter comprises triethyl boron (TEB); and the second reactant comprise ammonia ($NH_3$), contributing nitrogen to the growing layer.

The examples presented below demonstrate the benefit of using a halogen-getter for the thin film deposition. Examples 1, 2 and 4 illustrate with cases where corrosion of copper metal surface was observed and the other examples illustrate cases where the corrosion was eliminated in accordance with preferred embodiments. The extent of corrosion was not quantified. Corrosion was either present or nonexistent, as determined by optical and SEM imaging. In practice, the tolerance for corrosion will depend upon the application.

Source Materials

In general, the source materials, (e.g., metal source materials, halogen getters and nitrogen source materials), are preferably selected to provide sufficient vapor pressure, sufficient thermal stability at substrate temperature and sufficient reactivity of the compounds for effecting deposition by ALD. "Sufficient vapor pressure" supplies enough source chemical molecules in the gas phase to the substrate surface to enable self-saturated reactions at the surface at the desired rate. "Sufficient thermal stability" means that the source chemical itself does not form growth-disturbing condensable phases on the surface or leave harmful level of impurities on the substrate surface through thermal decomposition. One aim is to avoid uncontrolled condensation of molecules on the substrate. "Sufficient reactivity" results in self-saturation in pulses short enough to allow for a commercially acceptable throughput time. Further selection criteria include the availability of the chemical at high purity and the ease of handling of the chemical.

The thin film transition metal nitride layers are preferably prepared from metal source materials and more preferably from the volatile or gaseous compounds of transition metals of groups 3, 4, 5, 6, 7, 8, 9, 10, 11 and/or 12 of the periodic table of the elements. Elemental metal thin film layers are also preferably made from these compounds or from starting materials comprising Cu, Ru, Pt, Pd, Ag, Au and/or Ir. More preferably, metal and metal nitride source materials comprise transition metal halides.

1. Halide Source Materials

The first reactant preferably includes a species corrosive to surfaces of the workpiece exposed during the deposition, particularly when combined with the second reactant. In the illustrated embodiment, the corrosive species of the first reactant is advantageous in that it provides a volatile source gas for delivering a desired depositing species. Moreover, the corrosive species facilitates self-limited deposition by forming a part of the ligand that inhibits further growth during the first pulse.

Particularly, the first reactants of the preferred embodiments comprise halides, and more preferably metal halides. As previously noted, metal halides are volatile and therefore excellent vehicles for delivery of metal to the workpiece. Moreover, halogen tails terminate the surface of the chemisorbed monolayer, inhibiting further reaction. The surfaces are thus self-saturated to promote uniform film growth.

In the illustrated embodiments (see Examples 3 and 5-7 below), each of the halide source materials comprise a metal halide that tends to induce etching or corrosion during ALD reactions. Examples 1, 2 and 4, for instance, each indicate corrosion of copper from exposure to ALD processes that include $TiCl_4$ or $WF_6$ pulses.

Figures 5, 11:
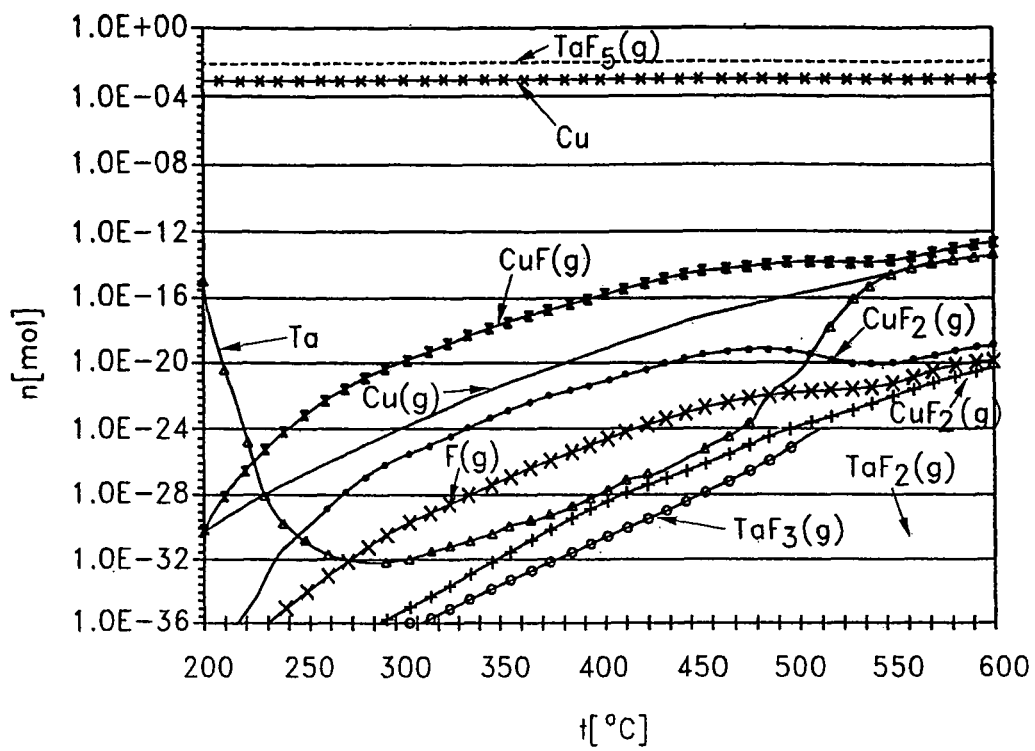
FIG. 5 is a graph depicting the equilibrium state of compounds between tantalum, fluorine and copper as a function of temperature. The source chemicals for the calculations were 10 mol $TaF_5$ and 1 mol Cu.
FIG. 11 is a table showing refractive metal halides that react (X) or do not react (O) with copper metal. (X) designates a lack of sufficient data for drawing conclusions regarding the ability to employ these reactants without gettering. The metals are in their highest possible oxidation state. Gibb's free energies of the reactions were calculated by a computer program (HSC Chemistry, version 3.02, Outokumpu Research Oy, Pori, Finland).

As shown by Example 8, however, $TaF_5$ does not etch copper during the tantalum nitride deposition. Thermodynamic calculations (see FIG. 5) support the experimental results and predict also that hafnium bromide and niobium fluoride do not corrode copper when depositing metal nitride (see FIG. 11). Low valence metal halides have less halogen atoms to donate and can be expected to corrode sensitive surfaces less than high valence metal halides. Metal halide source chemical can be transported over a reducing agent before the substrate space in order to lower the valence or oxidation state of the metal in metal halide, thus reducing the halide content of the metal halide and decreasing the corrosion probability of substrate surfaces. The method of using a solid or liquid reducing agent before the substrate space is described in our pending Finnish patent application FI 19992235. Metal sources such as $TaF_5$, hafnium bromide and niobium fluoride, therefore, are not considered to be corrosive in the ALD processes at issue. Accordingly, such metal source materials can be employed without the gettering method disclosed below.

The gettering method has been successfully employed with transition metal halides, especially with halides of elements selected from groups IV (Ti, Zr and Hf), V (V, Nb and Ta) and VI (Cr, Mo and W) in the periodic table of elements. The nomenclature of the groups is according to the system recommended by the IUPAC. Fluorides, chlorides, bromides and iodides of transition metals can be used, depending on the specific metal. Some metal-halogen compounds, for example $ZrF_4$, are not volatile enough for ALD processes.

2. Gettering or Scavenging Agents 2.1 Boron Compounds

In the examples, the gettering agent triethyl boron (TEB) was employed to protect copper surfaces against corrosion. Of the possible reaction products, the following ones are beneficial for the gettering effect:

Boron halides, formed by the reaction of halogen (e.g., from a metal halide, hydrogen halide or ammonium halide) with the center boron atom of the TEB molecule;

Ethyl halides, formed by the reaction of halogen (e.g., from a metal halide, hydrogen halide or ammonium halide) with an ethyl group of the TEB molecule; or Ethane, formed by the reaction of hydrogen (e.g., from a hydrogen halide molecule) and an ethyl group of the TEB molecule.

It will be understood by those skilled in the art that the gettering effect presented herein is not limited to TEB. One class of boron compounds is boranes ($B_xH_y$).

Volatile boron compounds having at least one boron-carbon bond are more preferred for certain metals, and hydrocarbon groups bound to boron are more preferred. Very long or bulky groups bonded to boron may shield the center atom of the molecule so that the favored reactions will take too much time or may require unacceptable process conditions, such as too high substrate temperatures. Accordingly, a getter compound is preferably selected from volatile boron compounds that have at least one boron-carbon bond.

2.2 Silicon Compounds

Silicon compounds with, e.g., alkyl groups bound to silicon can be used for gettering halogens or hydrogen halides, as shown in reaction equations R1 and R2. It is assumed that each reaction with a hydrogen halide molecule consumes one silicon-carbon bond. Accordingly, the getter compound can be selected from volatile silicon compounds that have at least one silicon-carbon bond.

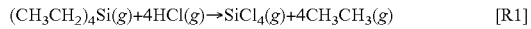

$(CH_3CH_2)_4Si(g) + 4HCl(g) \rightarrow SiCl_4(g) + 4CH_3CH_3(g)$ [R1]

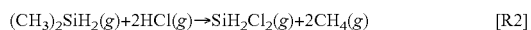

$(CH_3)_2SiH_2(g) + 2HCl(g) \rightarrow SiH_2Cl_2(g) + 2CH_4(g)$ [R2]

2.3 Germanium and Tin Compounds

Germanium compounds with alkyl groups bound to germanium, as well as alkyl tin compounds, are within the bounds of possibility when gettering halogens or hydrogen halides is needed. Accordingly, the getter compound can be selected from volatile germanium and tin compounds that have at least one metal-carbon bond.

2.4 Aluminum, Gallium and Indium Compounds

In case of alkyl aluminum, gallium or indium compounds, the reactions show some harmful complexity. As an example, trimethylaluminum (TMA) decomposes in the presence of metal halides, leaving carbon on the surfaces. Use of these compounds for gettering halogens or hydrogen halides requires careful setup of ALD process parameters. However, in less preferred arrangements, the getter compound can be selected from volatile aluminum, gallium or indium compounds that have at least one metal-carbon bond.

2.5 Carbon Compounds

In case of carbon compounds, it is possible to find a binding place for hydrogen halides when there exists double or triple bonded carbon in the molecule (R3 and R4). Calculating thermodynamical favorability for the reactions is difficult because surface chemistry differs from the gas phase chemistry e.g. due, for example, to the absorption and desorption energies. For getter compounds selected from volatile carbon compounds, the compounds preferably have at least one double or triple bond between carbon atoms.

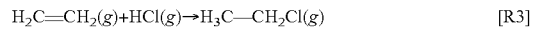

$H_2C=CH_2(g) + HCl(g) \rightarrow H_3C—CH_2Cl(g)$ [R3]

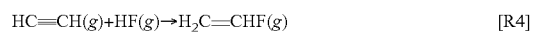

$HC≡CH(g) + HF(g) \rightarrow H_2C=CHF(g)$ [R4]

2.6 Nitrogen Compounds

In case of nitrogen compounds, the problem is that usually nitrogen halides are thermally unstable. Reactions between alkyl-nitrogen and hydrogen halide compounds forming any nitrogen halide are probably not favorable. However, formation of alkyl chloride from alkyl amine is theoretically possible (R5). Free Gibb's energies ($\Delta G_f$) were calculated. Kinetic factors affecting the reaction speed have not been resolved. Getter compounds selected from volatile amines preferably have negative or near zero value of free Gibb's energy for the reaction between amine and the halogen-bearing species (e.g., hydrogen halide or ammonium halide or free halogen), leading to the formation of halogenated carbon compound.

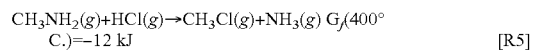

$CH_3NH_2(g) + HCl(g) \rightarrow CH_3Cl(g) + NH_3(g)$ $G_f(400°C.) = -12$ kJ [R5]

Certain amines are stronger bases than ammonia ($NH_3$). Such amines can form a salt-like compound with an acidic hydrogen halide molecule without breaking it. The bonding enhances the removal of hydrogen halide from a copper metal surface before any corrosion occurs. Getter compounds selected from volatile amines preferably form sufficiently stable salts with hydrogen halides or have negative or near zero value of free Gibb's energy for the reaction between volatile amine and hydrogen halide that leads to the formation of volatile amine-hydrochloride salts.

2.7 Phosphor Compounds

Phosphor halides are quite stable and using organophosphor compounds for gettering halogens or hydrogen halides is possible. The formation of metal phosphides is a competing reaction and, depending on the application, phosphorus compounds may not be accepted. A getter compound selected from phosphor compounds preferably has at least one phosphor-carbon bond.

2.8 Zinc Compounds

Alkyl zinc compounds are commercially available. Currently, zinc is not compatible with state-of-the-art process flows for integrated circuits. Under circumstances where zinc exposure is acceptable, a getter compound can be selected from zinc compounds that have at least one zinc-carbon bond.

2.9 Iron and Lead Compounds

Organo-iron and organo-lead compounds form volatile metal halides. A getter compound can be selected from iron or lead compounds that have at least one metal-carbon bond.

2.10 Metallocene Compounds

A getter compound can be selected from volatile metallocenes, such as ferrocene, dicyclopentadienyliron, or volatile derivatives of metallocenes, such as 1,1'-di(trimethylsilyl)ferrocene, said metals being capable of forming volatile metal halides.

2.11 Boron-Silicon Compounds

A getter compound can also be selected from volatile boron-silicon compounds that have at least one boron-silicon bond, such as tris(trimethylsilyl)borane. Both silicon and boron are capable of forming volatile halides.

2.12 Metal Carbonyl Compounds

A getter compound can be selected from volatile metal carbonyls or volatile derivatives of metal carbonyls, such as cyclohexadieneiron tricarbony, where such metals are capable of forming volatile metal halides.

2.13 General Reaction Equations for Organic Gettering Agents

A general reaction equation for the gettering of halogen with a volatile $E(—CL_3)_mG_n$ compound is presented in R6. E is an element in periodic table; L is a molecule bonded to carbon C; X is a halogen; G is an unspecified molecule or atom bonded to E; and m and n are integers, where the sum of m and n depends on the valence of E. There is a chemical bond between E and C.

$$E(—CL_3)_mG_n + HX \rightarrow E(—X)(—CL_3)_{m-1}G_n + CL_3X \quad [R6]$$

A general reaction equation for the gettering of hydrogen halide with a volatile $E(—CL_3)_mG_n$ compound is presented in R7. There is a chemical bond between E and C. E is an element in periodic table; L is a molecule bonded to carbon C; X is a halogen; G is an unspecified molecule or atom bonded to E; and m and n are integers, where the sum of m and n depends on the valence of E. The reaction equations are simplified. In reality there are additional reactions between the surface and a chemisorbing E compound.

$$E(—CL_3)_mG_n + HX \rightarrow E(—X)(—CL_3)_{m-1}G_n + CL_3H \quad [R7]$$

The getter compounds $E(—CL_3)_mG_n$ is selected from a chemical compound that can bind halogen or hydrogen halide or that can dissociate hydrogen halide or ammonium halide to form non-corroding volatile halogen compounds.

2.14 Silane Borane and Germanium Compounds

Regarding silanes ($Si_xH_y$) and boranes ($B_mH_n$) where x, y, m and n are positive integers, R8-R10 represent thermodynamically favorable reactions that can bind hydrogen halides into less corrosive compounds.

$$SiH_4(g) + 4HCl(g) \rightarrow SiCl_4(g) + 4H_2(g) \; \Delta G_f(400°\,C.) = -269\,kJ \quad [R8]$$

$$BH_3(g) + 3HCl(g) \rightarrow BCl_3(g) + 3H_2(g) \; \Delta G_f(400°\,C.) = -193\,kJ \quad [R9]$$

$$B_2H_6(g) + 6HCl(g) \rightarrow 2BCl_3(g) + 6H_2(g) \; \Delta G_f(400°\,C.) = -306\,kJ \quad [R10]$$

Ammonium halides react with silanes and boranes (R11-R14), but they are also capable of disturbing the growth of transition metal nitrides by forming silicon or boron nitride (R15-R18). The reactivity of ammonium halides is based on the well-known fact that they start to dissociate into ammonia ($NH_3$) and hydrogen halide when heated.

$$SiH_4(g) + 4NH_4F \rightarrow SiF_4(g) + 4NH_3(g) + 4H_2(g) \; \Delta G_f(400°\,C.) = -711\,kJ \quad [R11]$$

$$SiH_4(g) + 4NH_4Cl \rightarrow SiCl_4(g) + 4NH_3(g) + 4H_2(g) \; \Delta G_f(400°\,C.) = -303\,kJ \quad [R12]$$

$$BH_3(g) + 3NH_4F \rightarrow BF_3(g) + 3NH_3(g) + 3H_2(g) \; \Delta G_f(400°\,C.) = -544\,kJ \quad [R13]$$

$$BH_3(g) + 3NH_4Cl \rightarrow BCl_3(g) + 3NH_3(g) + 3H_2(g) \; \Delta G_f(400°\,C.) = -219\,kJ \quad [R14]$$

$$4SiH_4(g) + 4N_4F \rightarrow SiF_4(g) + Si_3N_{4+16}H_2(g) \; \Delta G_f(400°\,C.) = -1600\,kJ \quad [R15]$$

$$4SiH_4(g) + 4NH_4Cl \rightarrow SiCl_4(g) + Si_3N_4 + 16H_2(g) \; \Delta G_f(400°\,C.) = -1193\,kJ \quad [R16]$$

$$4BH_3(g) + 3NH_4F \rightarrow BF_3(g) + 3BN + 12H_2(g) \; \Delta G_f(400°\,C.) = -1549\,kJ \quad [R17]$$

$$4BH_3(g) + 3NH_4Cl \rightarrow BCl_3(g) + 3BN + 12H_2(g) \; \Delta G_f(400°\,C.) = -1224\,kJ \quad [R18]$$

When there are ammonium halide molecules ($NH_4F$, $NH_4Cl$, $NH_4Br$, $NH_4I$) on the reaction chamber surface, it is beneficial to use as little silane or borane as possible to prevent the formation of non-volatile silicon nitride or boron nitride. When there are hydrogen halide molecules (HF, HCl, HBr, HI) on the reaction chamber surface, the dosage of silane or borane is adjusted so that acidic hydrogen halides form silicon halides or boron halides, but there are practically no surplus silane or borane molecules that could bind onto metal or metal nitride surface and disturb the metal or metal nitride growth.

Germanes ($Ge_rH_t$, where r and t are positive integers) can form volatile germanium halides, especially with hydrogen halides.

Although there are just pure silicon-hydrogen, boron-hydrogen and germanium-hydrogen compounds in the examples, a person skilled in the art will easily find in the literature that there exists series of similar compounds useful as gettering agents. In silanes ($Si_xH_y$), boranes ($B_mH_n$) and germanes ($Ge_rH_t$), hydrogen atoms can be replaced by halogen atoms one by one, for example $SiH_4 \rightarrow SiH_3F \rightarrow SiH_2F_2 \rightarrow SiHF_3$. Mixed halogen compounds, such as $SiH_2FCl$, are also possible. These compounds can serve as gettering agents as long as there is at least one hydrogen atom bound to silicon, boron or germanium.

As a general rule, a getter compound can be selected from silanes, boranes or germanes that have at least one hydrogen atom bound to silicon, boron or germanium.

3. Source Materials for Second Reactant

The second reactant generally also includes a species corrosive to surfaces of the workpiece exposed during the deposition, particularly when combined with the second reactant. In the illustrated embodiment, the corrosive species of the first reactant is advantageous in that it provides a volatile source gas for delivering a desired depositing species.

In "pure" metal deposition by ALD, the second reactant is replaces with another pulse of the first reactant. In Example 3, for instance, the first and second reactant pulses both comprise $WF_6$. Thus, only one reactant is alternated with the getter phase. Each $WF_6$ pulse can potentially produce volatile halide compounds or free excited halide species that could corrode sensitive surfaces like copper, aluminum or silicon oxide. Exposing a halide-terminated metal to ammonia, for example, tends to produce hydrofluoric acid (HF) and ammonium fluoride ($NH_4F$).

For forming binary, ternary or more complex materials, a subsequent reactant preferably comprises a hydrogen-containing compound, and in the illustrated case of metal nitride deposition also provides nitrogen to the metal nitride deposition process. The second reactant used as the nitrogen source material is preferably volatile or gaseous. Ammonia, for example, is both volatile and highly reactive, promoting rapid reaction with the chemisorbed species from the first reactant. Preferably, the second reactant is selected from the following group:

ammonia ($NH_3$);

salts of ammonia, preferably halide salt, in particular ammonium fluoride or ammonium chloride;

hydrogen azide (HN$_3$) and the alkyl derivatives of the said compound such as CH$_3$N$_3$;

Hydrazine (N$_2$H$_4$) and salts of hydrazine such as hydrazine hydrochloride;

organic derivatives of hydrazine such as dimethyl hydrazine;

Nitrogen fluoride (NF$_3$);

primary, secondary and tertiary amines such as methylamine, diethylamine and triethylamine;

nitrogen radicals such as NH$_2$*, NH and N* where "*" designates a free electron capable of forming a bond; and other excited species including nitrogen (N).

While the getter phase is of particular utility in combination with hydrogen-bearing reactants, it remains advantageous when employed prior to other reactants, such as the listed NF$_3$ and hydrogen-free nitrogen radicals.

Alternatively, this second reactant can provide carbon to form metal carbides. For example, after a WF$_6$ pulse, it has been found that TEB does not merely getter halide tails, but rather leaves some carbon in a ligand exchange reaction. Metal carbide serves as an excellent barrier material in place of, or in addition to, metal nitride within a nanolaminate.

4. Selection Criteria Regarding Source Materials

Metal corrosion is expected if Gibb's energy ($\Delta G_f$) is negative or near zero for the reaction between metal halide and metal;
hydrogen halide and metal; or
ammonium halide and metal, where the metal represents a sensitive surface during a reaction, and hydrogen halide and/or ammonium halide are formed as by-products of surface reactions.

Silicon compound (e.g., silicon oxide or silicon nitride) corrosion is expected on a surface if Gibb's free energy ($\Delta G_f$) is negative or near zero for the reaction between hydrogen halide and silicon compound;
ammonium halide and silicon compound, where the silicon compound represents a sensitive surface during a reaction, and hydrogen halide and/or ammonium halide are formed as by-products of surface reactions.

If theoretical calculations suggest that corrosion is possible, it is recommended to add a getter to the process. The getter molecules combine with corrosive molecules and prevent the corrosion of sensitive surfaces.

The selection of the getter compound can be based on molecular simulations. An exemplary simulation program is HyperChem release 4.5, commercially available from Hypercube Inc., Florida, USA. Said program helps to visualize the physical appearance and electrostatic potential geometry of getter molecule candidates and to estimate whether or not molecules, such as triethyl boron, have accessible areas for reacting with corrosive molecules. Molecules with structures that are physically or electrostatically shielded from reaction with the potentially harmful chemical make poor getters, as they increase the reaction times and the throughput of a reactor will suffer. Simulation of reactions between molecules and surfaces requires more complex software. Cerius$^2$, commercially available from Molecular Simulation Inc. (MSI), USA, is an example of a program capable of predicting the outcome of chemical reactions.

The Chemistry

To further illustrate the chemistry in the transition metal nitride thin film growth, a plurality of examples are provided herein. Generally, a conformal and uniformly thick metal nitride is desired. ALD permits metal monolayers to be reacted with nitrogen in alternating pulses.

In the first scheme, titanium tetrachloride (TiCl$_4$) is taken as an example of a metal source material and ammonia (NH$_3$) is an example of a nitrogen-containing compound. The substrate is a silicon wafer having a native oxide on the surface. TiCl$_4$ reacts with the OH-containing surface sites of the substrate.

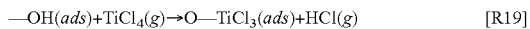

A reducing agent R is used to reduce TiCl$_3$ to TiCl$_2$.

The possible reaction mechanisms between the nitrogen-containing compound, in this example NH$_3$, are numerous and complex. For example:

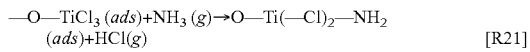

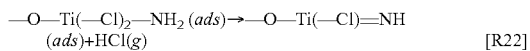

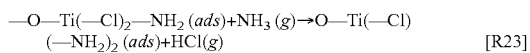

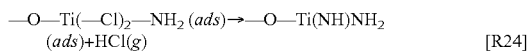

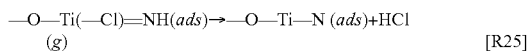

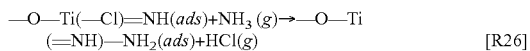

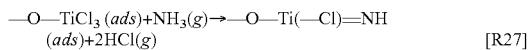

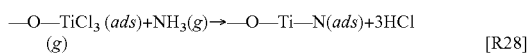

Reaction equations R21 through R28 refer to unreduced titanium.

The next TiCl$_4$ pulse will react with the active sites, such as by reacitons 29 or 30:

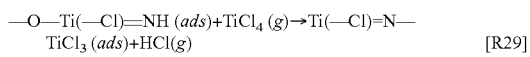

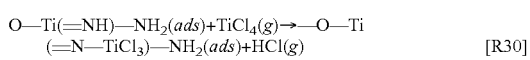

Most favorable nitride surface sites for chemisorbing metal-containing constituents, especially metal halides, are sites with =NH or —NH$_2$ groups. The surface density of =NH and —NH$_2$ groups may vary according to the nitrogen source chemical used.

When aiming for lower resistivity, titanium with three bonds is preferred because TiN has lower resistivity than nitrogen-rich titanium nitride. In the final nitride crystal lattice, the bonding situation is more complex than in the simplified scheme above, because ions occupy different types of sites and the bonds can have ionic or covalent nature, as well as possible dangling bonds near crystal defects and grain boundaries. Each pulsing cycle adds up to a molecular layer of titanium or nitrogen containing species which form the nitride lattice. However, due to bulky ligands around adsorbed metal atoms or a small number of active surface sites, the growth rate can be less than one molecular layer per cycle.

In the second scheme, tungsten hexafluoride (WF$_6$) is taken as an example of metal source material and ammonia (NH$_3$) is an example of a nitrogen compound rich in hydrogen. The substrate is a silicon wafer with a silicon dioxide ($SiO_2$) coating. There are surface sites with —OH groups on $SiO_2$. In a metal pulse, these sites react with $WF_6$ molecules (R19). A subsequent ammonia pulse generates even more HF gas (R20). It must be noted that the presentation of W—N bonds is a simplified one. In reality W and N are forming a lattice and they share electrons with several neighbor atoms.

$$\text{—OH}(ads.) + WF_6(g) \rightarrow \text{O—WF}_5(ads.) + HF(g) \quad [R31]$$

$$\text{—WF}_5(ads.) + 2NH_3(g) \rightarrow \text{—W}(\equiv N)(\equiv NH)(ads.) + 5HF(g) \quad [R32]$$

Due to high HF production, a corrosive side reaction can occur on the surface (R21). All the reaction products are highly volatile and they leave the substrate. As a result $SiO_2$ is etched. As a generalization, it can be said that incompatibility problems are possible when metal fluorides and hydrogen-rich nitrogen compounds contact silicon oxides.

$$SiO_2(s) + 4HF(g) \rightarrow SiF_4(g) + 2H_2O(g) \; \Delta G_f(400°\,C.) = -43\,kJ \quad [R33]$$

In the third scheme, there is a copper metal coating on the surface of a substrate. Titanium tetrachloride ($TiCl_4$) is taken as an example of a metal chloride source chemical and ammonia ($NH_3$) is an example of a nitrogen compound rich in hydrogen.

$$Cu(s) + TiCl_4(g) \rightarrow CuCl_4(s) + TiCl_4(s) \; \Delta G_f(400°\,C.) = -11\,kJ \quad [R34]$$

$$Cu\text{—OH}(ads.) + TiCl_4(g) \rightarrow Cu\text{—O—TiCl}_3(ads.) + HCl(g)$$

$$\text{—TiCl}_3(ads.) + NH_3(g) \rightarrow \text{—Ti(—Cl)}_2(\text{—NH}_2)(ads.) + HCl(g)$$

As discussed below, with respect to EXAMPLE 1, corrosion of the copper surface is observed.

$$2Cu(s) + 2HCl(g) \rightarrow 2CuCl(s) + H_2(g) \; \Delta G_f(400°\,C.) = -41\,kJ \quad [R35]$$

$$2Cu(s) + 2NH_4Cl(s) \rightarrow 2CuCl(s) + H_2(g) + 2NH_3(g) \; \Delta G_f(400°\,C.) = -59\,kJ \quad [R36]$$

EXAMPLES

In practicing the preferred embodiments, the conditions in the reaction space are preferably arranged to minimize gas-phase reactions that can lead to the formation of condensed material. Reactions between species chemisorbed on the surface and a gaseous reactant self-saturate. Reactions between by-products and a gaseous getter form volatile chemical compounds.

The deposition can be carried out at a wide range of pressure conditions, but it is preferred to operate the process at reduced pressure. The pressure in the reactor is preferably maintained between about 0.01 mbar and 50 mbar, more preferably between about 0.1 mbar and 10 mbar.

The substrate temperature is kept low enough to keep the bonds between thin film atoms below the surface intact and to prevent thermal decomposition of the gaseous source chemicals. On the other hand, the substrate temperature is kept high enough to provide activation energy barrier for the surface reactions, to prevent the physisorption of source materials and minimize condensation of gaseous reactants in the reaction space. Depending on the reactants, the temperature of the substrate is typically 100° C.-700° C., preferably about 250° C.-400° C.

The source temperature is preferably set below the substrate temperature. This is based on the fact that if the partial pressure of the source chemical vapor exceeds the condensation limit at the substrate temperature, controlled layer-by-layer growth of the thin film is compromised.

As the growth reactions are based on self-saturated surface reactions, there is no need for setting tight boundaries for pulse and purge times. The amount of time available for the pulsing cycle is limited mostly by the economical factors, such as desired throughput of the product from the reactor. Very thin film layers can be formed by relatively few pulsing cycles and in some cases this allows the use of low vapor pressure source materials with relatively long pulse times.

Example 1

The Deposition of TiN from $TiCl_4$ and $NH_3$

A 200-mm silicon wafer coated with PVD copper was loaded into a Pulsar 2000™ ALD reactor, commercially available from ASM Microchemistry Oy of Espoo, Finland. The substrate was heated to 400° C. in a flowing nitrogen atmosphere. The pressure of the reactor was adjusted to about 5 mbar by the mass flow controller on the nitrogen line and a vacuum pump. Next, a $TiN_x$ layer was grown by ALD from sequential pulses of $TiCl_4$ and $NH_3$ that were separated by inert nitrogen gas.

One deposition cycle consisted of the following steps:
$TiCl_4$ pulse, for 0.05 s
$N_2$ purge for 1.0 s
$NH_3$ pulse for 0.75 s
$N_2$ purge for 1.0 s This cycle was repeated 300 times to form about a 5-nm $TiN_x$ film. The growth rate of the $TiN_x$ film was about 0.17 Å/cycle. Then the wafer was unloaded from the reactor for analysis. Four-point probe and Energy Dispersive Spectroscopy (EDS) measurements gave a resistivity of 150 μΩcm.

$$6TiCl_4(g) + 8NH_3(g) \rightarrow 6TiN + 24HCl(g) + N_2(g) \; \Delta G_f(400°\,C.) = -19\,kJ \quad [R37]$$

Equation R37 is a simplified presentation of the reaction. It is assumed that there are reactive sites, such as —NH and =NH, on the surface, which attract $TiCl_4$ molecules. After $TiCl_4$ pulse there are probably —$TiCl_3$ and =$TiCl_2$ groups on the surface which can react with the $NH_3$ molecules of the following pulse.

The theoretical result of equation R37 is a uniformly thick $TiN_x$ film over the copper surface. FIG. 2 shows, however, that there was pitting corrosion on the copper film. Corrosion is initiated when HCl, which is formed as a by-product in the nitride growth (R37), reacts with copper. As HCl reacts easily with surplus $NH_3$, forming ammonium chloride ($NH_4Cl$), it is also possible that $NH_4Cl$ acts as a gas-phase carrier for copper chloride.

Example 2

Deposition of WN from $WF_6$ and $NH_3$

A 200-mm silicon wafer coated with PVD copper was loaded to a Pulsar 2000 ALD reactor. The substrate was heated to 400° C. in a flowing nitrogen atmosphere. The pressure of the reactor was adjusted to about 5 mbar by the mass flow controller on the nitrogen line and a vacuum pump. Next, a $WN_x$ layer was grown by ALD from sequential pulses of $WF_6$ and $NH_3$ that were separated by inert nitrogen gas.

One deposition cycle consisted of the following steps:
$WF_6$ pulse for 0.25 s
$N_2$ purge for 1.0 s NH$_3$ pulse for 0.75 s
N$_2$ purge for 1.0 s This cycle was repeated 70 times to form about a 5-nm WN$_x$ film. The growth rate of the WN$_x$ film was about 0.6 Å/cycle. Then the wafer was unloaded from the reactor for analysis.

Etch damage to the copper film was visible even under an optical microscope because of the nitride process. A lot of HF was evolves from the process (R38). HF may attack the copper surface (R39). Corrosion of copper was not expected because the vapor pressure of copper fluoride is low at the substrate temperature. HF, however, also readily reacts with surplus NH$_3$ during the ammonia pulse, forming ammonium fluoride. Thus, NH$_4$F can act as a vapor phase carrier for CuF, resulting in corrosion.

$$2WF_6(g)+4NH_3(g) \rightarrow 2WN+12HF(g)+N_2(g) \quad [R38]$$

$$Cu+HF(g) \rightarrow CuF+1/2H_2(g) \quad [R39]$$

Example 3

Deposition of WC$_x$ with a Gettering Compound

A 200-mm silicon wafer coated with PVD copper was loaded into a Pulsar 2000™ ALD reactor. The substrate was heated to about 400° C. in a flowing nitrogen atmosphere. The pressure of the reactor was adjusted to about 5 mbar by the mass flow controller on the nitrogen line and a vacuum pump. A thin film rich in tungsten metal was grown by ALD from sequential pulses of WF$_6$ and triethyl boron (TEB), which were separated by inert nitrogen gas.

One deposition cycle consisted of the following steps:
WF$_6$ pulse for 0.25 s
N$_2$ purge for 1.0 s
TEB pulse 0.05 for s
N$_2$ purge for 1.0 s This cycle was repeated 70 times to form about a 5-nm W-rich tungsten carbide film. The growth rate of the thin film was about 0.6 Å/cycle. Then the wafer was unloaded from the reactor for analysis. No corrosion of copper was observed by Scanning Electron Microscopy (referred to as SEM hereinafter). The exact reaction mechanism between the monolayer left by the WF$_6$ pulse and the TEB pulse is not known. It is assumed that TEB acts as a halogen getter, forming boron fluoride and ethyl fluoride gases that leaves some carbon in the film.

Example 4

Deposition of W/TiN on Copper Metal

A 200-mm silicon wafer coated with PVD copper is loaded into a Pulsar 2000™ ALD reactor. The substrate is heated to 350° C. in a flowing nitrogen atmosphere. The pressure of the reactor is adjusted to about 5 mbar to 10 mbar by the mass flow controller on the nitrogen line and a vacuum pump. Thin film rich in tungsten metal is grown by ALD from sequential pulses of WF$_6$ and nido-pentaborane (B$_5$H$_9$), which are separated by inert nitrogen gas:

One deposition cycle consists of the following steps:
WF$_6$ pulse for 1.0 s
N$_2$ purge for 1.0 s
B$_5$H$_9$ pulse for 3.0 s
N$_2$ purge for 1.0 s The deposition cycle is repeated suffcient times to form about a 5-nm W-rich film. After that, a TiN$_x$ layer is grown by ALD from sequential pulses of TiCl$_4$ and NH$_3$, which are separated by inert nitrogen gas.

One deposition cycle consisted of the following steps:
TiCl$_4$ pulse for 0.05 s
N$_2$ purge for 1.0 s
NH$_3$ pulse for 0.75 s
N$_2$ purge for 1.0 s The deposition cycle is repeated 200 times to form about a 5-nm TiN$_x$ film over the tungsten film. Finally, the wafer is unloaded from the reactor for analyses. Corrosion of copper is observed by optical microscope. Thus, 5 nm of W is not enough to protect the copper surface from corrosive reactions during the TiN$_x$ deposition by ALD.

Example 5

Deposition of WN with a Gettering Compound on Copper Metal

A 200-mm silicon wafer coated with PVD copper was loaded into a Pulsar 2000™ ALD reactor. The substrate was heated to 400° C. in a flowing nitrogen atmosphere. The pressure of the reactor was adjusted to about 5 mbar by the mass flow controller on the nitrogen line and a vacuum pump. Tungsten nitride thin film was grown by ALD from sequential pulses of WF$_6$, TEB and NH$_3$ that were separated by inert nitrogen gas pulses.

One deposition cycle consisted of the following steps:
WF$_6$ pulse for 0.25 s
N$_2$ purge for 1.0 s
TEB pulse for 0.05 s
N$_2$ purge for 1.0 s
NH$_3$ pulse for 0.75 s
N$_2$ purge for 1.0 s This cycle was repeated 70 times to form about a 5-nm W-rich film. The growth rate of the thin film was about 0.6 Å/cycle. Then the wafer was unloaded from the reactor for analysis.

No corrosion of copper was observed by SEM. The exact reaction mechanism between WF$_6$ and TEB is not known. It is assumed that TEB forms boron fluoride and ethyl fluoride gases, leaving negligible residue on the surface.

Example 6

Deposition of WN/TiN Nanolaminate with a Gettering Compound

Two different types of 200-mm wafers were used for the experiment. One wafer had a PVD copper coating while the other wafer had an Electrochemically Deposited (ECD) copper film. The copper-coated wafers were loaded into a Pulsar 2000™ ALD reactor, one by one. The substrate was heated to 400° C. in flowing nitrogen atmosphere. The pressure of the reactor was adjusted to about 5 mbar by the mass flow controller on the nitrogen line and a vacuum pump.

First, a WN$_x$ layer was grown by ALD from sequential pulses of WF$_6$, triethyl boron (TEB) and NH$_3$ that were separated by inert nitrogen gas pulses.

One deposition cycle consisted of the following steps:
WF$_6$ pulse for 0.25 s
N$_2$ purge for 1.0 s
TEB pulse for 0.05 s
N$_2$ purge for 0.3 s
NH$_3$ pulse for 0.75 s
N$_2$ purge for 1.0 s TEB acts as a getter compound that can remove halogen from the surface. The deposition cycle was repeated 70 times to form about a 5-nm $WN_x$ layer. The growth rate of $WN_x$ was about 0.6 Å/cycle.

Next, a $TiN_x$ layer was grown over the $WN_x$ layer by ALD from sequential pulses of $TiCl_4$ and $NH_3$ that were separated by inert nitrogen gas pulses. One deposition cycle consisted of the following steps:

$TiCl_4$ pulse for 0.05 s
$N_2$ purge for 1.0 s
$NH_3$ pulse for 0.75 s
$N_2$ purge for 1.0 s This cycle was repeated 300 times to form about a 5-nm $TiN_x$ film over the $WN_x$ film. The growth rate of the $TiN_x$ film was about 0.17 Å/cycle. Then the wafer was unloaded from the reactor for analysis. Four-point probe and Energy Dispersive Spectroscopy (EDS) measurements gave a resistivity of about 140 μΩcm.

The same deposition program was used for both types of copper-coated silicon. FIGS. 3 and 4 show that there was no pitting or corrosion of copper during the deposition. Accordingly, 5 nm of $WN_x$ was sufficient to protect underlying PVD or ECD copper from corrosion during the $TiN_x$ deposition.

Example 7

Deposition of TiN with a Gettering Compound on Copper Metal

A 200-mm silicon wafer coated with PVD copper was loaded into a Pulsar 2000™ ALD reactor. The substrate was heated to 400° C. in a flowing nitrogen atmosphere. The pressure of the reactor was adjusted to about 5 mbar by the mass flow controller on the nitrogen line and a vacuum pump. TiN layer was grown by ALD from sequential pulses of $TiCl_4$, TEB and $NH_3$ that were separated by inert nitrogen gas pulses.

One deposition cycle consisted of the following steps:

$TiCl_4$ pulse for 0.05 s
$N_2$ purge for 1.0 s
TEB pulse for 0.05 s
$N_2$ purge for 1.0 s
$NH_3$ pulse for 0.75 s
$N_2$ purge for 1.0 s This cycle was repeated 300 times to form about a 5-nm $TiN_x$ film. The growth rate of the $TiN_x$ film was about 0.17 Å/cycle. The wafer was unloaded from the reactor for inspection. Optical microscope revealed no signs of corrosion when used with the ×40 magnification. The exact nature of the surface reactions involved is not known. Without desiring to be limited by theory, it is believed that $TiCl_4$ molecules preferably attach to =NH and —$NH_2$ groups on the surface. Some feasible reactions liberating HCl are presented in (R28) and (R29). It is assumed that TEB scavenged liberated HCl.

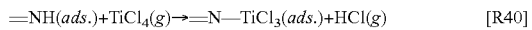

=NH(ads.)+TiCl$_4$(g)→=N—TiCl$_3$(ads.)+HCl(g)  [R40]

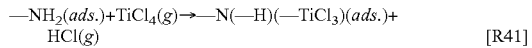

—NH$_2$(ads.)+TiCl$_4$(g)→—N(—H)(—TiCl$_3$)(ads.)+ HCl(g)  [R41]

Further process improvement is to add a TEB pulse following the $NH_3$ pulse for absorbing the rest of the HCl molecules that can form in the surface reactions. Some possible reactions liberating more HCl are presented in equations R42 and R43.

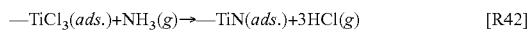

—TiCl$_3$(ads.)+NH$_3$(g)→—TiN(ads.)+3HCl(g)  [R42]

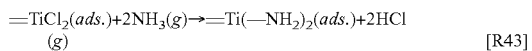

=TiCl$_2$(ads.)+2NH$_3$(g)→=Ti(—NH$_2$)$_2$(ads.)+2HCl (g)  [R43]

Example 8

Deposition of Tantalum Nitride

A 50 mm×50 mm piece of copper-coated silicon wafer was loaded into an F-120™ ALD reactor, commercially available from ASM Microchemistry, Oy of Espoo, Finland. The substrate was heated to 400° C. in flowing nitrogen atmosphere. The pressure of the reactor was adjusted by nitrogen mass flow controller and a vacuum pump to about 5 mbar. Tantalum nitride layer was grown by ALD from sequential pulses of $TaF_5$ and $NH_3$ that were separated by inert nitrogen gas.

One deposition cycle consisted of the following steps:

$TaF_5$ pulse for 0.2 s
$N_2$ purge for 1.0 s
$NH_3$ pulse for 1.0 s
$N_2$ purge for 2.0 s This cycle was repeated 2000 times to form about a 16-nm $Ta_xN_y$ film. The growth rate of the film was about 0.08 Å/cycle. The wafer was unloaded from the reactor for inspection. Neither optical microscope nor SEM showed any signs of copper corrosion.

Example 9

Deposition of a Nanolaminate Structure

A silicon substrate was loaded into an F-200™ ALD reactor, commercially available from ASM Microchemistry, Oy of Espoo, Finland. The reactor pressure was balanced to 5 mbar absolute by a vacuum pump and flowing nitrogen. The substrate was heated to 360° C. First, a titanium nitride film was grown no the substrate by repeating a pulsing sequence. Inert nitrogen gas carried titanium tetrachloride vapor into the reaction chamber. Surplus $TiCl_4$ and reaction by-products were purged away with $N_2$ gas. After purging, $N_2$ gas carried ammonia vapor to the reaction chamber. Surplus $NH_3$ and reaction by-products were purged away with $N_2$ gas:

$TiCl_4$ pulse for 0.05 s
$N_2$ purge for 1.0 s
$NH_3$ pulse for 0.75 s
$N_2$ purge for 1.0 s A tungsten nitride thin film was grown on top of the titanium nitride film by repeating another pulsing sequence:

$WF_6$ pulse for 0.25 s
$N_2$ purge for 1.0 s
TEB pulse for 0.05 s
$N_2$ purge for 0.3 s
$NH_3$ pulse for 0.75 s
$N_2$ purge for 1.0 s The processing was continued by depositing alternating thin film layers of titanium and tungsten nitride. Altogether 6 to 18 nitride thin film layers were deposited, depending on the sample. The total thickness of the ALD nanolaminate was approximately 70 nm. The film appeared as a dark, light reflecting mirror. The color was slightly reddish, unlike either titanium or tungsten nitride. The film was analyzed by transmission electron microscopy (TEM), energy dispersive spectroscopy (EDS) and four-point probe measurements. TEM pictures (FIG. 10) showed a clear nanolaminate structure with separate titanium and tungsten nitride thin film layers. According to EDS, there were titanium, tungsten and nitrogen molecules in the film. The amount of impurities was estimated to be below 1 at.-%. The film was electrically conductive. The resistivity was calculated by combining the thickness (EDS) and four-point probe results. The resistivity of the non-optimized samples was approximately 400 μΩ-cm.

Example 10

Deposition of a Metal/Metal Nitride Nanolaminate Using Two Transition Metal Sources A nanolaminate was created with alternating thin film layers of metal and metal nitride, using the ALD processes described above. Two different transition metal sources were used for the thin film layers.

Thin film layer 4: tantalum nitride.
Thin film layer 3: tungsten metal.
Thin film layer 2: tantalum nitride.
Thin film layer 1: tungsten metal.
Substrate.

Odd thin film layers (1, 3, 5 etc. . . .) were deposited from a tungsten source chemical and a reducing source chemical. Even thin film layers (2, 4, 6 etc. . . .) were deposited from a tantalum source chemical, an optional reducing source chemical and a nitrogen source chemical. All source chemical pulses were separated from each other with an inert purge gas.

Example 11

Deposition of a Metal/Metal Nitride Nanolaminate Using One Transition Metal A nanolaminate was created with alternating thin film layers of metal nitride and metal. One transition metal source was used for the thin film layers.

Thin film layer 4: tungsten metal
Thin film layer 3: tungsten nitride.
Thin film layer 2: tungsten metal.
Thin film layer 1: tungsten nitride.
Substrate.

Odd thin film layers (1, 3, 5 etc. . . .) were deposited from a tungsten source chemical, an optional reducing source chemical and a nitrogen source chemical. Even thin film layers (2, 4, 6 etc. . . .) were deposited from a tungsten source chemical and a reducing chemical. All source chemical pulses were separated from each other with an inert purge gas.

Although the foregoing invention has been described in terms of certain preferred embodiments, other embodiments will be apparent to those of ordinary skill in the art, in view of the disclosure herein. Accordingly, the present invention is not intended to be limited by the recitation of the preferred embodiments, but is instead to be defined by reference to the appended claims.

We claim:

1. An atomic layer deposition (ALD) process for growing a carbon-containing metallic film on a substrate in a reaction space comprising the sequential steps of:
    a) feeding a vapor-phase pulse of a metal source chemical into the reaction space with an inert carrier gas;
    b) purging the reaction space with an inert gas;
    c) feeding a vapor-phase pulse of a gettering compound into the reaction space, wherein the gettering compound comprises carbon and leaves carbon in the film and wherein the gettering compound is selected from the group consisting of alkyl aluminum, alkyl zinc, organolead, organo-iron, gallium and indium compounds that have at least one metal-carbon bond;
    d) purging the reaction space with an inert gas; and
    e) repeating steps a) through d) until the carbon-containing metal film of a desired thickness is formed.

2. The process of claim 1, wherein the gettering compound is trimethylaluminum.

3. An atomic layer deposition (ALD) process for growing a metal nitride film on a substrate in a reaction space comprising the sequential steps of:
    a) feeding a vapor-phase pulse of a metal source chemical into the reaction space with an inert carrier gas;
    b) purging the reaction space with an inert gas;
    c) feeding a vapor-phase pulse of a carbon compound into the reaction space wherein the carbon compound is selected from the group consisting of carbon compounds where there exists double or triple bonded carbon;
    d) purging the reaction space with an inert gas;
    e) feeding a vapor-phase pulse of a nitrogen source chemical into the reaction space;
    f) purging the reaction space with an inert gas; and
    g) repeating steps a) through f) until a metal nitride film of a desired thickness is formed.

4. The process of claim 3, wherein the carbon compound is $C_2H_2$ or $C_2H_4$.

* * * * *